US 6,597,547 B1

(12) United States Patent  
Kawawake et al.

(10) Patent No.: US 6,597,547 B1  
(45) Date of Patent: Jul. 22, 2003

(54) MAGNETORESISTIVE DEVICE WITH AN α-FE₂O₃ ANTIFERROMAGNETIC FILM AND INDIRECT EXCHANGE COUPLING FILM LAYERS OF DIFFERING THICKNESS

(75) Inventors: Yasuhiro Kawawake, Hirakata (JP); Mitsuo Satomi, Katano (JP); Yasunari Sugita, Kadoma (JP); Hiroshi Sakakima, Kyotanabe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/162,300

(22) Filed: Sep. 28, 1998

(30) Foreign Application Priority Data

Sep. 29, 1997 (JP) .............................. 9-263212

(51) Int. Cl.⁷ ................................................ G11B 5/39
(52) U.S. Cl. ................................................ 360/324.11
(58) Field of Search .................................. 360/324.11

(56) References Cited

U.S. PATENT DOCUMENTS

| | | | |
|---|---|---|---|
| 5,373,238 A | | 12/1994 | McGuire et al. |
| 5,583,725 A | | 12/1996 | Coffey et al. |
| 5,688,380 A | | 11/1997 | Koike et al. |
| 5,701,223 A | * | 12/1997 | Fontana, Jr. et al. |
| 5,742,458 A | | 4/1998 | Koike et al. |
| 5,766,743 A | * | 6/1998 | Fujikata et al. |
| 5,828,529 A | * | 10/1998 | Gill |
| 5,923,504 A | * | 7/1999 | Araki et al. |
| 5,958,611 A | * | 9/1999 | Ohta et al. |
| 6,051,309 A | * | 4/2000 | Fujikata et al. |
| 6,061,210 A | * | 5/2000 | Gill |

FOREIGN PATENT DOCUMENTS

| | | |
|---|---|---|
| EP | 0 687 917 A2 | 12/1995 |
| JP | 59-087616 | 5/1984 |
| JP | 07-169026 A | 7/1995 |
| JP | 07-297465 A | 11/1995 |
| JP | 08-204253 A | 8/1996 |
| JP | 08-279117 | 10/1996 |
| JP | 09-050612 A | 2/1997 |
| JP | 09-092904 | 4/1997 |
| JP | 09-148132 A | 6/1997 |
| JP | 09-148651 | 6/1997 |
| JP | 9-251618 | 9/1997 |
| WO | WO97/11499 | 3/1997 |

OTHER PUBLICATIONS

European Search Report, Application No. EP 01 11 3584, dated Sep. 18, 2001.

(List continued on next page.)

Primary Examiner—Craig A. Renner  
(74) Attorney, Agent, or Firm—Renner, Otto, Boisselle & Sklar, LLP

(57) ABSTRACT

A magnetoresistance effect device of the present invention includes a multilayer film. The multilayer film includes an antiferromagnetic film, a first ferromagnetic film, a non-magnetic film and a second ferromagnetic film, which are provided in this order on a non-magnetic substrate directly or via an underlying layer. The antiferromagnetic film comprises an α-Fe₂O₃ film. A surface roughness of the multilayer film is about 0.5 nm or less.

8 Claims, 16 Drawing Sheets

OTHER PUBLICATIONS

Egelhoff, et al.; "Optimizing the giant magnetoresistance of symmetric and bottom spin valves (invited)"; *J. Appl. Phys.;* vol. 79, No. 8, pp. 5277–5281, Apr. 15, 1996.

Japanese Office Action dated Jul. 1, 1999 and English translation.

Search Report for Application No. 98118338.7–2208–; Dated Mar. 19, 1999 (EPO).

M.N. Baibich et al., Physical Review Letters, vol. 61, No. 21, pp. 2472–2475, 1988, "Giant Magnetoresistance of (001) Fe/(001) Cr Magnetic Superlattices".

S.S.P. Parkin et al., Physical Review Letters, vol. 64, No. 19, pp. 2304–2307, "Oscillations in Exchange Coupling and Magnetoresistance in Metallic Superlattice Structures: Co/Ru, Co/Cr, and Fe/Cr".

B. Dieny et al., Journal of Magnetism and Magnetic Materials 93, pp. 101–104, 1991, "Spin–Valve Effect in Soft Ferromagnetic Sandwiches".

H. Hoshiya et al., Nihon Oyo Jiki Gakkaishi, vol. 18, No. 2, pp. 355–359, 1994, "Giant Magnetoresistance of Spin Valve Films with NiO Antiferromagnetic Films".

H.J.M. Swagten et al., Physical Review B, vol. 53, No. 14, pp. 9108–9114, 1996, "Enhanced Giant Magnetoresistance in Spin–Valves Sandwiched Between Insulating NiO".

* cited by examiner

- 6 Second ferromagnetic film
- 5 Non-magnetic film
- 4 First ferromagnetic film
- 3 Antiferromagnetic film ($\alpha$-$Fe_2O_3$ film)
- 1 Substrate

- 2 Underlying film

FIG.2A

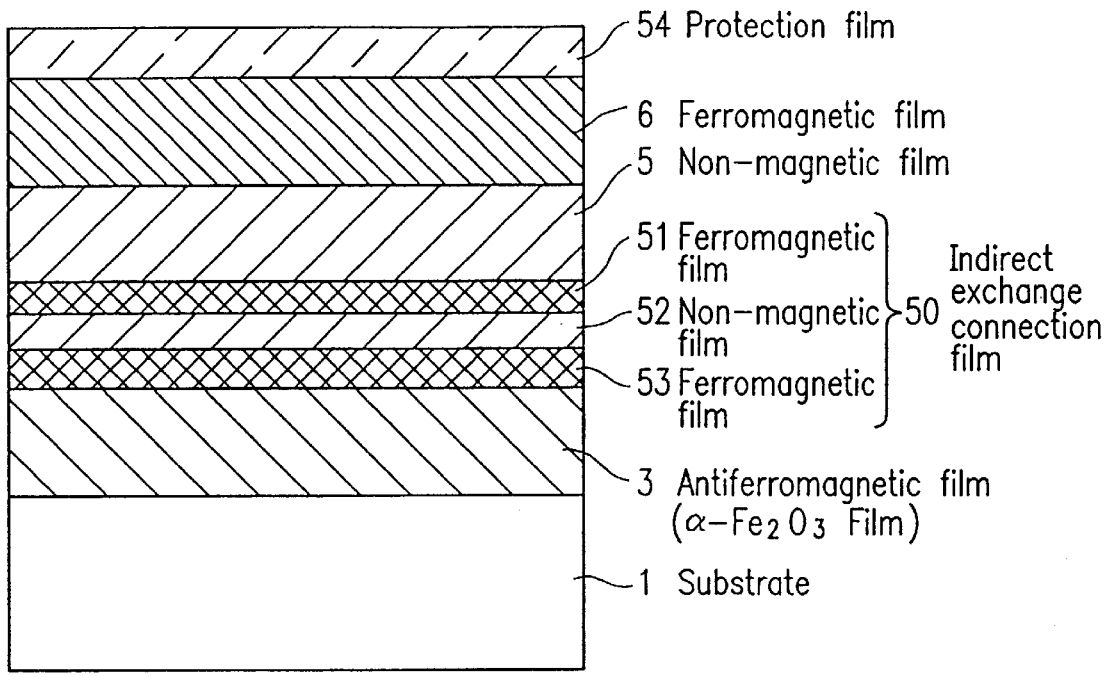

- 54 Protection film
- 6 Ferromagnetic film
- 5 Non-magnetic film
- 51 Ferromagnetic film
- 52 Non-magnetic film ⎫ 50 Indirect exchange connection film
- 53 Ferromagnetic film
- 3 Antiferromagnetic film ($\alpha$-$Fe_2O_3$ Film)
- 1 Substrate

FIG.2B

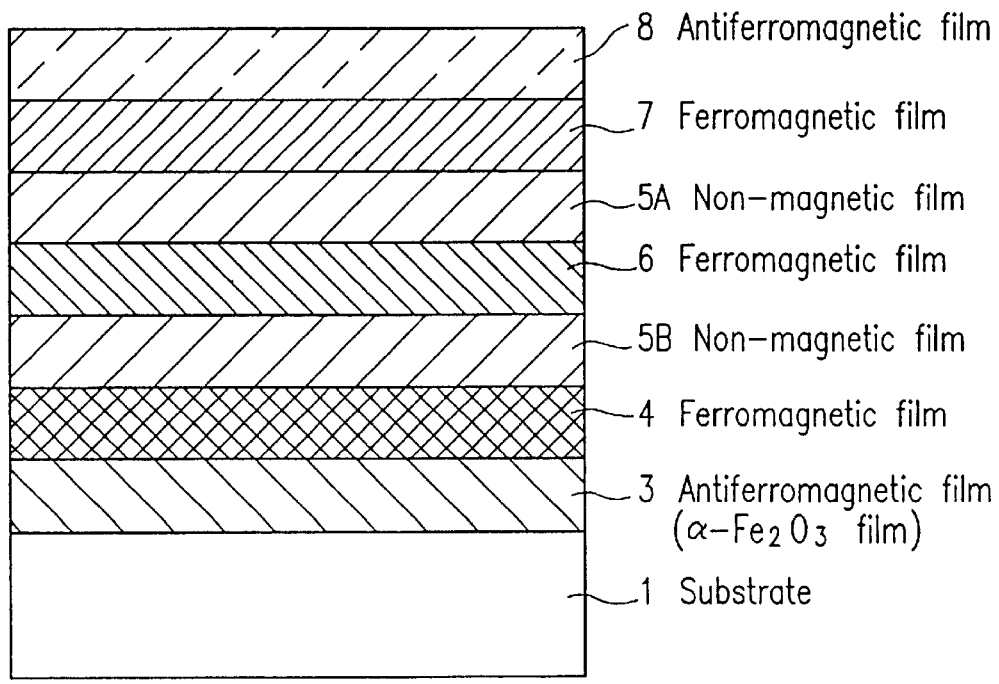

- 8 Antiferromagnetic film
- 7 Ferromagnetic film
- 5A Non-magnetic film
- 6 Ferromagnetic film
- 5B Non-magnetic film
- 4 Ferromagnetic film
- 3 Antiferromagnetic film ($\alpha$-$Fe_2O_3$ film)
- 1 Substrate

MAGNETORESISTIVE DEVICE WITH AN α-FE$_2$O$_3$ ANTIFERROMAGNETIC FILM AND INDIRECT EXCHANGE COUPLING FILM LAYERS OF DIFFERING THICKNESS

BACKGROUND OF THE INVENTION

1. Field of the Invention

The present invention relates to a magnetoresistance effect device which causes a substantial magnetoresistance change with a low magnetic field, a magnetoresistance head incorporating the same which is suitable for use in high density magnetic recording and reproduction, and a method for producing a magnstoresistance effect device.

2. Description of the Related Art

A magnetoresistance sensor (hereinafter, referred to simply as an "MR sensor") and a magnetoresistance head (hereinafter, referred to simply as an "MR head") employing a magnetoresistance effect device (hereinafter, referred to simply as an "MR device") have been developed and used in practice. For a magnetic body in the MR device, typically, an Ni$_{0.8}$Fe$_{0.2}$ parmalloy film or an Ni$_{0.8}$Co$_{0.2}$ alloy film is used. When using such a magnetoresistance effect material, the resulting magnetoresistance rate of change (hereinafter, referred to simply as an "MR ratio") is about 2%. A larger MR ratio has been desired for an MR device with a higher sensitivity. Recently, it has been found that an [Fe/Cr] or [Co/Ru] artificial grating film which is antiferromagnetically connected via a metallic, non-magnetic thin film such as a Cr film or an Ru film exhibits a large resistance change of substantially 100% (giant magnetoresistance effect) under a strong magnetic field (about 1 to 10 kOe) (Physical Review Letter, Vol. 61, p. 2472 (1988); Physical Review Letter, Vol. 64, p. 2304 (1990)). However, such an artificial grating film requires a strong magnetic field of several kOe to several tens of koe to obtain a large MR change, and thus is not very practical for use in a magnetic head, or the like.

A spin valve type film where an antiferromagnetic material, Fe—Mn, is attached to Ni—Fe/Cu/Ni—Fe has also been proposed (Journal of Magnetism and Magnetic Materials 93, p. 101, (1991)), which is capable of operating under a slight magnetic field. In such a spin valve film, a ferromagnetic film (pin layer) in contact with the ferromagnetic material is provided with a unidirectional anisotropy through an exchange connection, whereby the magnetization direction of the ferromagnetic film is fixed in a certain direction. On the other hand, the magnetization direction of the ferromagnetic layer (free layer), which is provided via the pin layer and a non-magnetic layer, can be changed relatively freely in response to an external signal magnetic field. Therefore, the respective magnetization directions of the pin layer and the free layer change with respect to each other, thereby varying the electric resistance. The necessary operating magnetic field of such an MR material is small, and, the linearity thereof is also good. However, the MR ratio of such an MR material is as low as about 2%, and the Fe—Mn film has a poor corrosion resistance. Moreover, since the Neel temperature of the Fe—Mn film is low, the device characteristics are substantially dependent upon temperature.

It has been proposed to use an oxide antiferromagnetic body such as NiO (Nihon Oyo Jiki Gakkaishi 18, p. 355 (1994)) or α-Fe$_2$O$_3$ (Japanese Laid-open Publication Nos. 8-279117 and 9-92904) as the antiferromagnetic body used in a spin valve film. A spin valve film employing an NiO film has an MR ratio of about 4% to 5% which is greater than that of a spin valve film employing Fe—Mn. However, such a spin valve film has not been used in practice since it is difficult to produce, and the heat stability of an exchange bias magnetic field thereof is poor. In the case of a spin valve film employing α-Fe$_2$O$_3$, the unidirectional anisotropy in the pin layer is weak, and the coercive force thereof is large. Therefore, such a spin valve film is likely to be a coercive force difference type spin valve film. Moreover, a sufficient MR ratio cannot be obtained unless the film is subjected to a heat treatment after the deposition.

Another type of spin valve having a structure such as Ni—Fe/Cu/Co—Pt and utilizing the coercive force difference between a hard magnetic film and a soft magnetic film has also been proposed, where a hard magnetic material (e.g., Co—Pt) is used in place of the antiferromagnetic material. In such a case, magnetization parallelism or magnetization antiparallelism is created by rotating the magnetization direction of the soft magnetic film (Ni—Fe film) by using a coercive force less than that required for a hard magnetic film. However, this type of spin valve has not been used in practice, since it is difficult to improve the characteristics of the soft magnetic layer.

As described above, the conventional spin valve type MR device does not have a sufficient MR ratio. The conventional spin valve employing NiO provides a high MR ratio, but has problems such as a poor heat stability, a undesirable hysteresis of the MR curve, and an insufficient pinning magnetic field. In the case of the other conventional spin valve film α-Fe$_2$O$_3$, the MR ratio is lower than that of the spin valve film employing Nio, and a sufficient MR ratio cannot be obtained unless the film is subjected to a heat treatment after the deposition.

SUMMARY OF THE INVENTION

According to one aspect of this invention, a magnetoresistance effect device of the present invention includes a multilayer film. The multilayer film includes an antiferromagnetic film, a first ferromagnetic film, a non-magnetic film and a second ferromagnetic film, which are provided in this order on a non-magnetic substrate directly or via an underlying layer. The antiferromagnetic film includes an α-Fe$_2$O$_3$ film. A surface roughness of the multilayer film is about 0.5 nm or less.

In one embodiment of the invention, 2, the first ferromagnetic film includes a Co$_{1-x}$Fe$_x$ alloy film (0<x≦0.5, where x denotes an atomic composition ratio).

In one embodiment of the invention, the first ferromagnetic film is formed by providing a Co$_{1-x}$Fe$_x$ alloy layer (0<x≦0.5, where x denotes an atomic composition ratio) on an Ni—Fe alloy layer or an Ni—Fe—Co alloy layer.

In one embodiment of the invention, a main component of the underlying layer is Pt or Au.

In one embodiment of the invention, a thickness of the α-Fe$_2$O$_3$ film is in a range between about 5 nm and about 40 nm.

In one embodiment of the invention, an easy axis of the second ferromagnetic film is arranged so as to be substantially. perpendicular to a direction of a signal magnetic field to be detected.

According to another aspect of this invention, a magnetoresistance effect device includes a multilayer film. The multilayer film includes an antiferromagnetic film, a first ferromagnetic film, a non-magnetic film and a second ferromagnetic film, which are provided in this order on a non-magnetic substrate directly or via an underlying layer.

The antiferromagnetic film includes a layered structure including an $\alpha$-Fe$_2$O$_3$ film and a second antiferromagnetic film.

In one embodiment of the invention, the second antiferromagnetic film includes an NiO film or a CoO film.

In one embodiment of the invention, the second antiferromagnetic film is overlying the $\alpha$-Fe$_2$O$_3$ film In one embodiment of the invention, the $\alpha$-Fe$_2$O$_3$ film is overlying the NiO film.

In one embodiment of the invention, an easy axis of the second ferromagnetic film is arranged so as to be substantially perpendicular to a direction of a signal magnetic field to be detected.

According to still another aspect of this invention a magnetoresistance effect device includes a multilayer film. The multilayer film includes an antiferromagnetic film, a first ferromagnetic film, a non-magnetic film and a second ferromagnetic film, which are provided in this order on a non-magnetic substrate directly or via an underlying layer. The antiferromagnetic film includes an $\alpha$-Fe$_2$O$_3$ film. A thickness of the $\alpha$-Fe$_2$O$_3$ film is in a range between about 5 nm and about 40 nm.

In one embodiment of the invention, an easy axis of the second ferromagnetic film is arranged so as to be substantially perpendicular to a direction of a signal magnetic field to be detected.

According to still another aspect of this invention, a magnetoresistance effect device includes a multilayer film. The multilayer film includes a first antiferromagnetic film, a first ferromagnetic film, a first non-magnetic film, a second ferromagnetic film, a second non-magnetic film, a third ferromagnetic film and a second antiferromagnetic film, which are provided in this order on a non-magnetic substrate directly or via an underlying layer. The first antiferromagnetic film includes an $\alpha$-Fe$_2$O$_3$ film. A surface roughness of the multilayer film is about 0.5 nm or less.

In one embodiment of the invention, an easy axis of the second ferromagnetic film is arranged so as to be substantially perpendicular to a direction of a signal magnetic field to be detected.

According to still another aspect of this invention a magnetoresistance effect device includes a multilayer film. The multilayer film includes a first antiferromagnetic film, a first ferromagnetic film, a first non-magnetic film, a second ferromagnetic film, a second non-magnetic film, a third ferromagnetic film and a second antiferromagnetic film, which are provided in this order on a non-magnetic substrate directly or via an underlying layer. The first antiferromagnetic film includes a layered structure including an $\alpha$-Fe$_2$O$_3$ film and a third antiferromagnetic film.

In one embodiment of the invention, the second antiferromagnetic includes an Ir—Mn film.

In one embodiment of the invention, an easy axis of the second ferromagnetic film is arranged so as to be substantially perpendicular to a direction of a signal magnetic field to be detected.

In one embodiment of the invention, at least one of the first ferromagnetic film and the third ferromagnetic film includes an indirect exchange coupling film.

According to still another aspect of this invention, a magnetoresistance effect device includes a multilayer film. The multilayer film includes an anti-ferromagnetic film, an indirect exchange coupling film, a first non-magnetic film, a first ferromagnetic film, which are provided in this order on a non-magnetic substrate directly or via an underlying layer.

The anti-ferromagnetic film includes an $\alpha$-Fe$_2$O$_3$ film. The indirect exchange coupling film includes a second non-magnetic film and a pair of second ferromagnetic films interposing the second non-magnetic film therebetween.

In one embodiment of the invention, a main component of the second ferromagnetic film is Co.

In one embodiment of the invention, a main component of the second non-magnetic film is Ru According to still another aspect of this invention, a magnetoresistance head includes: a magnetoresistance effect device as described above; and a shield gap section for insulating the magnetoresistance effect device from a shield section.

According to still another aspect of this invention, a method for producing a magnetoresistance effect device is provided. The device includes a multilayer film, the multilayer film includes an antiferromagnetic film, a first ferromagnetic film, a non-magnetic film and a second ferromagnetic film, which are provided in this order on a non-magnetic substrate directly or via an underlying layer. The method includes: a first step of forming the antiferromagnetic film having a thickness in a range between about 5 nm and about 40 nm on the non-magnetic substrate directly or via the underlying layer; and a second step of depositing, on the antiferromagnetic film, the first ferromagnetic film, the non-magnetic film and the second ferromagnetic film in this order so that a surface roughness of the multilayer film is about 0.5 nm or less. The first step includes a step of sputtering a target whose main component is $\alpha$-Fe$_2$O$_3$.

According to still another aspect of this invention a method for producing a magnetoresistance effect device is provided. The device includes a multilayer film, the multilayer film includes a first antiferromagnetic film, a first ferromagnetic film, a first non-magnetic film, a second ferromagnetic film, a second non-magnetic film, a third ferromagnetic film and a second antiferromagnetic film, which are provided in this order on a non-magnetic substrate directly or via an underlying layer. The method includes: a first step of forming the first antiferromagnetic film on the non-magnetic substrate directly or via the underlying layer; a second step of depositing, on the antiferromagnetic film, the first ferromagnetic film, the first non-magnetic film, the second ferromagnetic film, the second non-magnetic film, the third ferromagnetic film and the second antiferromagnetic film in this order so that a surface roughness of the multilayer film is about 0.5 nm or less. The first step a step of sputtering a target whose main component is $\alpha$-Fe$_2$O$_3$.

Thus, the invention described herein makes possible the advantages of: (1) providing an MR device which exhibits a large MR ratio by using an $\alpha$-Fe$_2$O$_3$ film or an $\alpha$-Fe$_2$O$_3$/NiO layered film so as to precisely control the surface roughness of the interface; (2) providing a method for producing such an MR device; and (3) providing an MR head incorporating such an MR device.

These and other advantages of the present invention will become apparent to those skilled in the art upon reading and understanding the following detailed description with reference to the accompanying figures.

BRIEF DESCRIPTION OF THE DRAWINGS

FIG. 2A is a cross-sectional diagram illustrating a structure of an MR device of the present invention;

FIG. 2B is a cross-sectional diagram illustrating a structure of an MR device of the present invention;

DESCRIPTION OF THE PREFERRED EMBODIMENTS

Figure 1A:
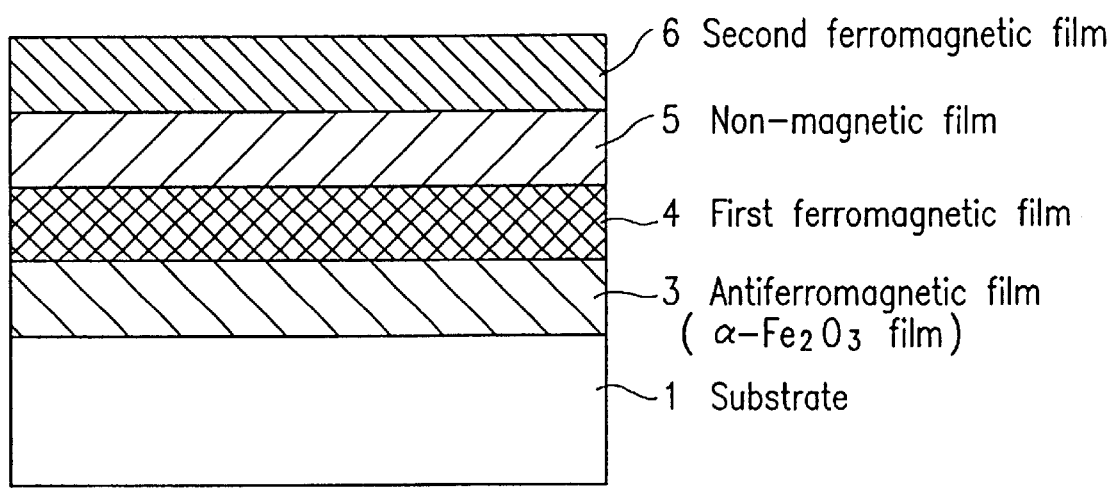
FIG. 1A is a cross-sectional diagram illustrating a structure of an MR device of the present invention.

An MR device and an MR head of the present invention will now be described with reference to the accompanying figures.

FIGS. 1A, 1B, 2A and 2B illustrate the MR device of the present invention. The MR device of the present invention includes an antiferromagnetic film 3, a first ferromagnetic film 4, a non-magnetic film 5 and a second ferromagnetic film 6, deposited in this order on a non-magnetic substrate 1. In the exemplary structure illustrated in FIGS. 1A and 1B, the first ferromagnetic film 4 (pin layer) is subject to an exchange bias magnetic field from the antiferromagnetic film 3, and thus has one fixed magnetization direction. In contrast, the magnetization direction of the second ferromagnetic film 6 provided on the non-magnetic film 5 changes relatively freely in response to an external magnetic field. Thus, the magnetization direction of the second ferromagnetic film (free layer) 6 and that of the first ferromagnetic film (pin layer) 4 change with respect to each other, thereby changing the electric resistance (magnetic resistance). Based on the same principle, an MR sensor can read a resistance change caused by the external magnetic field as an electric signal.

Preferably, the antiferromagnetic film 3 is an oxide antiferromagnetic film such as an NiO film, a CoO film or an $\alpha$-$Fe_2O_3$ film. The $\alpha$-$Fe_2O_3$ film is particularly preferred. It is known that, among the conventional metallic antiferromagnetic materials, the MR ratio of the spin valve film using NiO is greater than that of the spin valve film using a metallic antiferromagnetic material such as Fe—Mn. This is explained as follows. When the spin valve film using NiO is used, a mirror reflection of conducted electrons occurs at the interface of the antiferromagnetic film 3 and the first ferromagnetic film (pin layer) 4 (Physical Review B, Vol. 53, p. 9108 (1996-II)). In order for a mirror reflection to occur at the interface, the interface between the antiferromagnetic film 3 and the first ferromagnetic film (pin layer) 4 is smooth enough in view of the wavelength of the conducted electrons (several angstroms). The present invention makes it possible to improve the smoothness of the interface and thereby obtain a larger MR ratio from an $\alpha$-$Fe_2O_3$ spin valve film than has been conventionally been realized (Japanese Laid-open Publication No. 8-279117 and 9-92904).

When evaluating the smoothness of the interface between an antiferromagnetic film and a ferromagnetic film, it is preferable to be able to directly evaluate the smoothness of the interface or the surface of the antiferromagnetic film 3. Otherwise, it may also be evaluated by measuring the smoothness of the surface of the multilayer film. In such a case, although the surface should preferably be completely Smooth across the entire area, there may be an undulation as high as several hundred angstroms, as long as the surface includes a smooth area with an angstrom tolerance. Preferably, about 10%, and more preferably about 20%, of the entire area should be smooth with only undulations of about 0.5 nm or less.

The exemplary structure illustrated in FIGS. 1A, 1B, 2A and 2B employs an $\alpha$-$Fe_2O_3$ film 3. One advantage of an oxide antiferromagnetic film over a metallic antiferromagnetic film, such as an Fe—Mn film, an Ni—Mn film, a Pd—Mn film, a Pt—Mn film, an Ir—Mn film or an Fe—Ir film, is that the oxide antiferromagnetic film 3 generally has a larger MR ratio. Another advantage thereof is that, when the MR device is used as an MR head, the thickness of the entire MR device including the shield gap material (corresponding to the shield gap distance d in FIG. 6) can be small because the oxide antiferromagnetic film 3 is an insulation film and thus can be considered as a part of the underlying insulation film (shield gap). An MR head with a small shield gap distance d is suitable for high density recording with a very high recording density expected in the future.

As illustrated in FIG. 1A, when the $\alpha$-$Fe_2O_3$ film 3 is used by itself, it should preferably have a thickness of at least about 5 nm, but about 40 nm or less.

When the $\alpha$-$Fe_2O_3$ film 3 is layered together with another antiferromagnetic film (not shown) such as an NiO film or a CoO film, it is possible to more effectively apply the exchange bias magnetic field to the pin layer 4 than in the case where the $\alpha$-$Fe_2O_3$ film 3 is used by itself. With the thickness being equal, a layered film provides advantages such as a greater exchange bias magnetic field and a larger MR ratio. With the MR characteristic being equal, a layered film is advantageous because the total thickness of the device can be smaller.

When the $\alpha$-$Fe_2O_3$ film 3 is layered together with another antiferromagnetic film (see, eg., FIGS. 2C and 2D) such as an NiO film or a CoO film, it is possible to more effectively apply the exchange bias magnetic field to the pin layer 4 than in the case where the α-Fe$_2$O$_3$ film 3 is used by itself. With the thickness being equal, a layered film provides advantages such as a greater exchange bias magnetic field and a larger MR ratio. With the MR characteristic being equal, a layered film is advantageous because the total thickness of the device can be smaller.

Where the α-Fe$_2$O$_3$ film 3 is layered on an NiO film, a CoO film, or the like, (see FIG. 2D) a great exchange bias magnetic field can be applied to the pin layer 4 (first ferromagnetic layer) when the thickness of the α-Fe$_2$O$_3$ film 3 is in a range between about 5 nm and about 40 nm, and more preferably in a range between about 10 nm and about 40 nm. In such a case, the thickness of the NiO or CoO film is preferably in a range between about 5 nm and about 40 nm, and more preferably in a range between about 10 nm and about 30 nm. The thickness of the α-Fe$_2$O$_3$ film 3 should be equal to or greater than that of the NiO or CoO film.

Figure 2C:
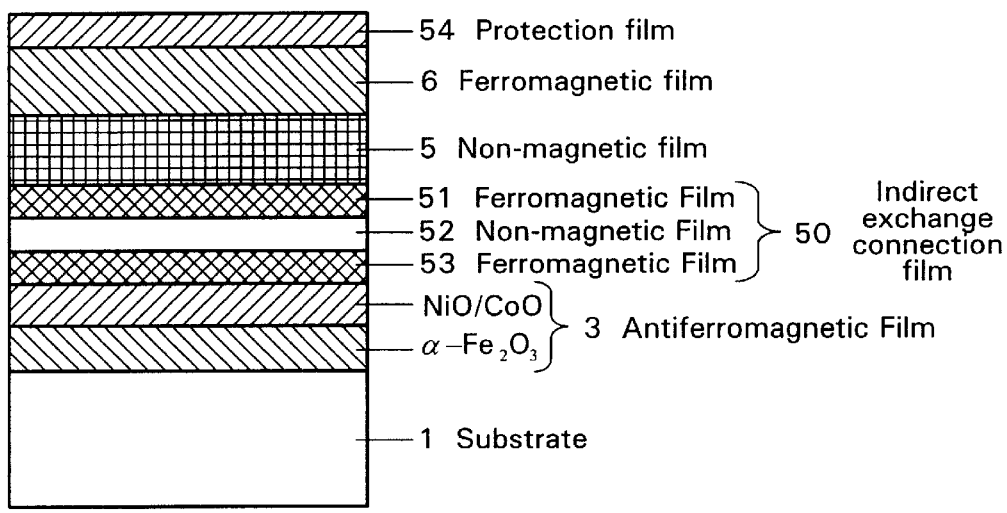
FIG. 2C is a cross-sectional diagram illustrating a structure of an MR device of the present invention.
Figure 2D:
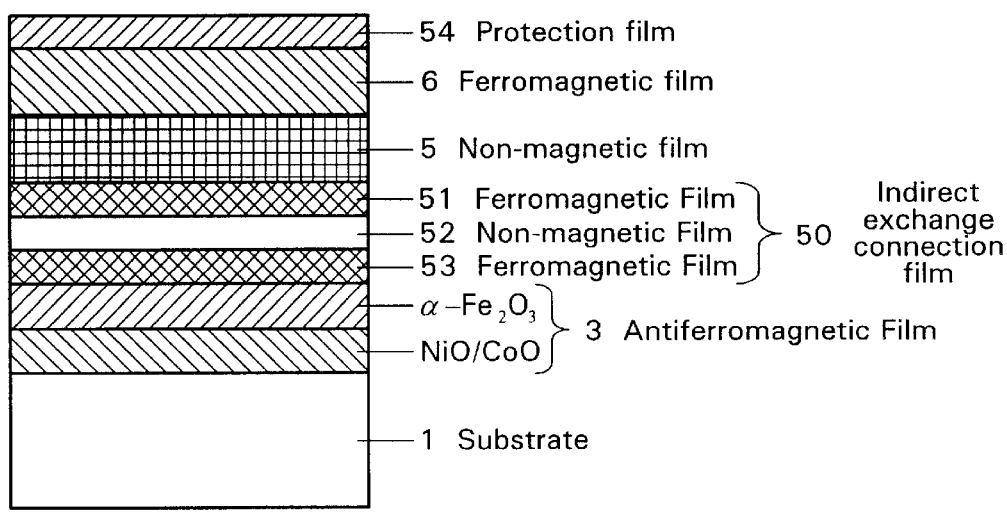
FIG. 2D is a cross-sectional diagram Illustrating a structure of an MR device of the present invention.

In the layered antiferromagnetic film, the NiO film preferably overlies the α-Fe$_2$O$_3$ film 3 (see FIG. 2C). Although such a layered antiferromagnetic film, as compared with one with the α-Fe$_2$O$_3$ film 3 overlying the NiO film, has a slightly lower MR ratio, it can provide a greater exchange bias magnetic field, whereby the entire structure can be thinner. For example, with a total thickness of about 20 nm, a sufficient exchange bias magnetic field can be provided. In such a case, the thickness of the α-Fe$_2$O$_3$ film is preferably in a range between about 5 nm and about 30 nm, and the thickness of the NiO film is preferably in a range between about 5 nm and about 20 nm.

It is also effective to use an indirect exchange coupling film 50 as illustrated in FIG. 2A in order to further increase the bias magnetic field applied to the pin layer 4 (or to further stabilize the magnetization direction of the pin layer 4). The indirect exchange coupling film 50 can be obtained by inserting an appropriate non-magnetic film 52 between ferromagnetic films 51 and 53. For example, by providing an Ru film having a thickness of about 0.7 nm as the non-magnetic film 52 and Co films as the ferromagnetic films 51 and 53, a strong indirect exchange interaction acts between the two ferromagnetic films 51 and 53, thereby stabilizing the magnetization direction of the pin layer 4. If the magnetization direction of the ferromagnetic film 53 is further secured by the antiferromagnetic film 3, the magnetization direction of the pin layer 4 is further stabilized.

In the structure illustrated in FIG. 2A, in addition to the Co film, a Co—Fe film, an Ni—Fe—Co film, or the like, may alternatively be used as the ferromagnetic films 51 and 53. The thickness of the ferromagnetic films 51 and 53 should be at least about 1 nm, and should preferably be about 4 nm or less. Preferably, the respective thicknesses of the ferromagnetic films 51 and 53 are not identical to each other, but rather differ from each other by at least about 0.5 nm. In addition to the Ru film, a Cu film, an Ag film, or the like, may alternatively be used as the non-magnetic film 52. Preferably, the thickness of the non-magnetic film 52 is in a range between about 0.3 nm and about 1.2 nm.

Si, glass, sapphire, MgO, or the like, can be used as a material of the substrate 1. In an MR head, an Al$_2$O$_3$—TiC substrate is typically used.

When a Co$_{1-x}$Fe$_x$ alloy (0<x≦0.5, where x denotes an atomic composition ratio) is used for the first and second ferromagnetic films 4 and 6, a large MR ratio can be obtained. Since it is important for the second ferromagnetic film 6 to have a soft magnetic property, an Ni—Fe alloy, an Ni—Fe—Co alloy, or the like, is typically used as a material thereof. As a material of the first ferromagnetic film 4, a Co$_{1-x}$Fe$_x$ alloy, or the like, is preferably used so as to maximize the MR ratio. Especially when a Cu film is used as the non-magnetic film, the Co$_{1-x}$Fe$_x$ alloy results in a substantial amount of scattering occurring depending upon a spin, thereby increasing the MR ratio. An Ni—Fe film, an Ni-rich Ni—Fe—Co film, or the like, is preferably used as the film which is in contact with the α-Fe$_2$O$_3$ film 3 and subject to an exchange bias magnetic field therefrom. Therefore, it is preferable to provide the first ferromagnetic film 4 in a layered structure including an Ni—Fe film, an Ni—Fe—Co film, or the like, on the α-Fe$_2$O$_3$ film 3 side, and a Co—Fe film, or the like, on the non-magnetic film 5 side. When the total thickness of the first ferromagnetic film 4 is excessively small, the MR ratio is reduced. When the total thickness of the first ferromagnetic film 4 is excessively large, on the other hand, the exchange bias magnetic field is reduced. Therefore, the total thickness of the first ferromagnetic film 4 is preferably in a range between about 2 nm and about 10 nm, and more preferably equal to or less than about 5 nm.

An Ni—Fe alloy, an Ni—Co—Fe alloy, or the like, is preferably used as a material of the second ferromagnetic film 6. Preferably, the atomic composition ratio of the Ni$_x$Co$_y$Fe$_z$ film may be:

0.6≦x≦0.9

0≦y≦0.4

0≦z≦0.3 (thereby obtaining an Ni-rich soft magnetic film); or

0≦x≦0.4

0.2≦y≦0.95

0≦z≦0.5 (thereby obtaining a Co-rich film).

A film having such a composition exhibits a low magnetostriction ($1\times10^{-5}$) which is required for an MR sensor or an MR head. An amorphous film such as a Co—Mn—B film, a Co—Fe—B film, a Co—Nb—Zr film or a Co—Nb—B film may alternatively be used as a material of the second ferromagnetic film 6.

Preferably, the thickness of the second ferromagnetic film 6 is in a range between about 1 nm and about 10 nm. When the second ferromagnetic film 6 is excessively thick, the MR ratio is reduced due to a shunt effect. When the second ferromagnetic film 6 is excessively thin, the soft magnetic property is reduced. More preferably, the thickness is in a range between about 2 nm and about 5 nm.

It is also effective to provide a Co—Fe alloy film as an interface magnetic film (not shown) at the interface between the second ferromagnetic film 6 and the non-magnetic film 5. When the interface magnetic layer is excessively thick, the sensitivity of the MR ratio to the magnetic field is reduced. Therefore, the thickness of the interface magnetic layer is preferably about 2 nm or less, and more preferably about 1 nm or less. In order for the interface magnetic film to effectively function, the thickness thereof should be at least about 0.4 nm.

While a Cu film, an Ag film, an Au film, a Ru film, or the like, can be used as the non-magnetic film 5, the Cu film is particularly preferred. Preferably, the thickness of the non-magnetic film 5 is at least about 1.5 nm, and more preferably at least about 1.8 nm, in order to sufficiently suppress the interaction between the magnetic films 4 and 6. When the non-magnetic film 5 is excessively thick, the MR ratio is reduced. Therefore, the thickness is preferably about 10 nm or less, and more preferably about 3 nm or less.

Figure 1B:
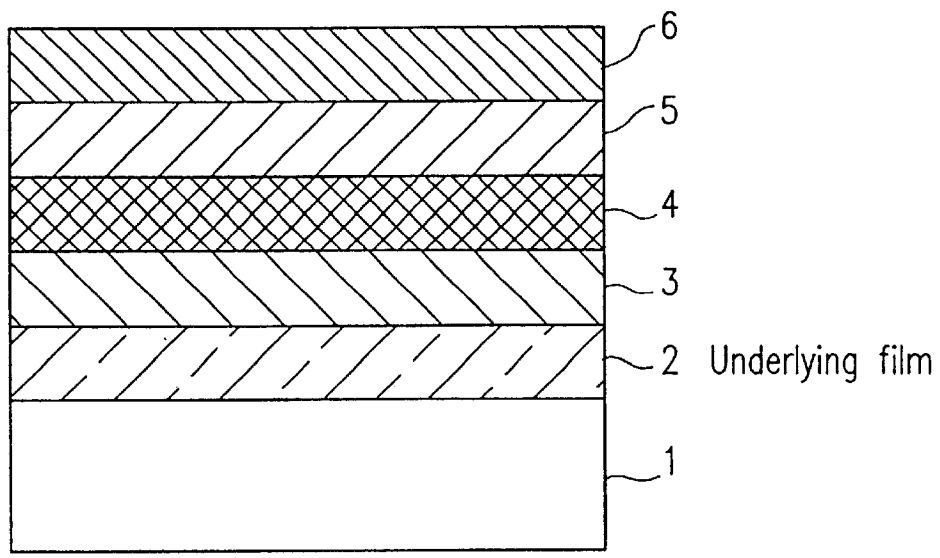
FIG. 1B is a cross-sectional diagram illustrating a structure of an MR device of the present invention.

A Pt film, an Au film, or the like, may be preferably used as an underlying layer 2 illustrated in FIG. 1B. When the α-Fe$_2$O$_3$ film 3 is formed on the underlying layer 2, the crystallinity of the $\alpha$-$Fe_2O_3$ film 3 is improved, and the exchange bias magnetic field applied to the first ferromagnetic film 4 is increased, thereby improving the MR characteristic. The underlying layer 2 has another advantage of smoothing the film surface. Thus, the interface between the antiferromagnetic film 3 and the first ferromagnetic film 4 is smoothed, and a mirror reflection effect is obtained, thereby increasing the MR ratio. The thickness of the underlying layer 2 is preferably at least about 1 nm, and more preferably at least about 10 nm. When the underlying layer 2 is excessively thick, the production yield is reduced. Therefore, the thickness of the underlying layer 2 is preferably about 50 nm or less, and more preferably about 20 nm or less.

While a so-called "single spin valve film" structure (where there is only one pin layer 4) has been described above, the present invention may also effectively used with a "dual spin valve film" structure (where there are two pin layers). An exemplary "dual spin valve film" structure is illustrated in FIG. 2B. Referring to FIG. 2B, the dual spin valve film structure additionally includes a third ferromagnetic film 7 and an antiferromagnetic film 8 on a non-magnetic film 5A. In this structure, the third ferromagnetic film 7 can be formed of the same material as that of the first ferromagnetic film 4. However, the antiferromagnetic film 8 is preferably not an oxide film such as an $\alpha$-$Fe_2O_3$ film or an NiO film. Instead, a metallic film using one of the following materials is more preferably used for the antiferromagnetic film 8: Fe—Mn, Ni—Mn, Pd—Mn, Pt—Mn, Ir—Mn, Cr—Al, Cr—Mn—Pt, Fe—Mn—Rh, Pd—Pt—Mn, Ru—Rh—Mn, Mn—Ru, Cr—Al, or the like. This is because, where an antiferromagnetic film is provided as an overlying layer, the exchange bias is more effective when the antiferromagnetic film is a metallic antiferromagnetic film than an oxide film. Among the above listed materials, Fe—Mn has been most typically used in a conventional spin valve film. However, in view of corrosion resistance, an Fe—Mn film is less preferred in the present invention, and an Ir—Mn film is particularly preferred. Preferably, the atomic composition ratio of an $Ir_zMn_{1-x}$ film may be;

$0.1 \leq z \leq 0.5$.

For example, the layers 1 to 8 may be formed by using a sputtering method, or a sputtering method in combination with a vapor deposition method. The sputtering includes a DC sputtering method, an RF sputtering method, an ion beam sputtering method, and the like, all of which may be suitably used for producing the MR device of the present invention. The RF sputtering method is particularly preferred for forming the $\alpha$-$Fe_2O_3$ film 3 or the NiO film.

Figure 3:
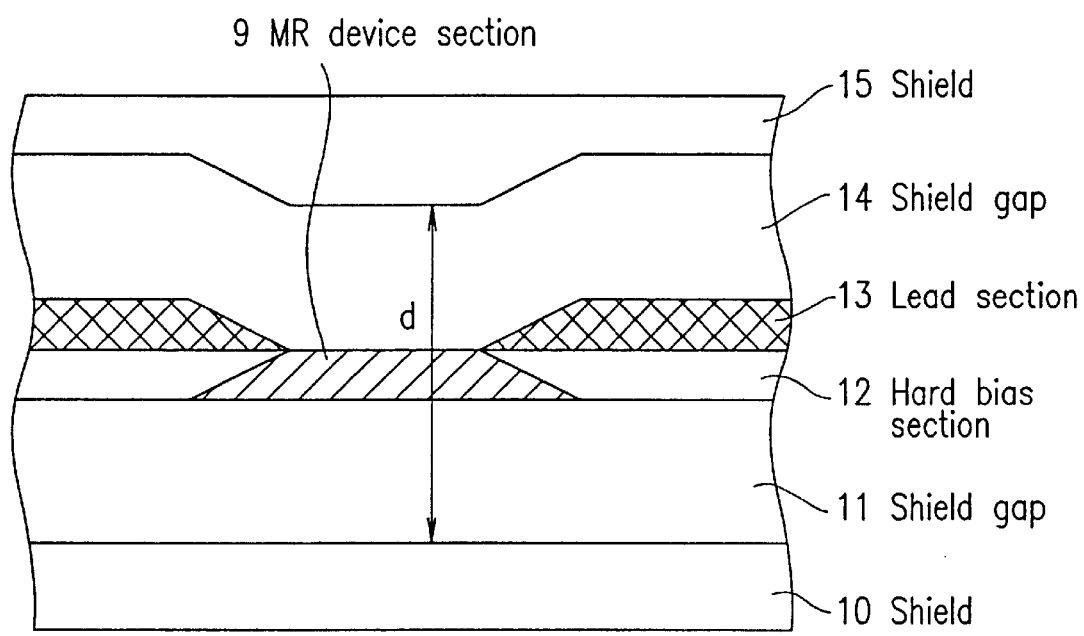
FIG. 3 is a cross-sectional diagram illustrating a structure of an MR head of the present invention.
Figure 4:
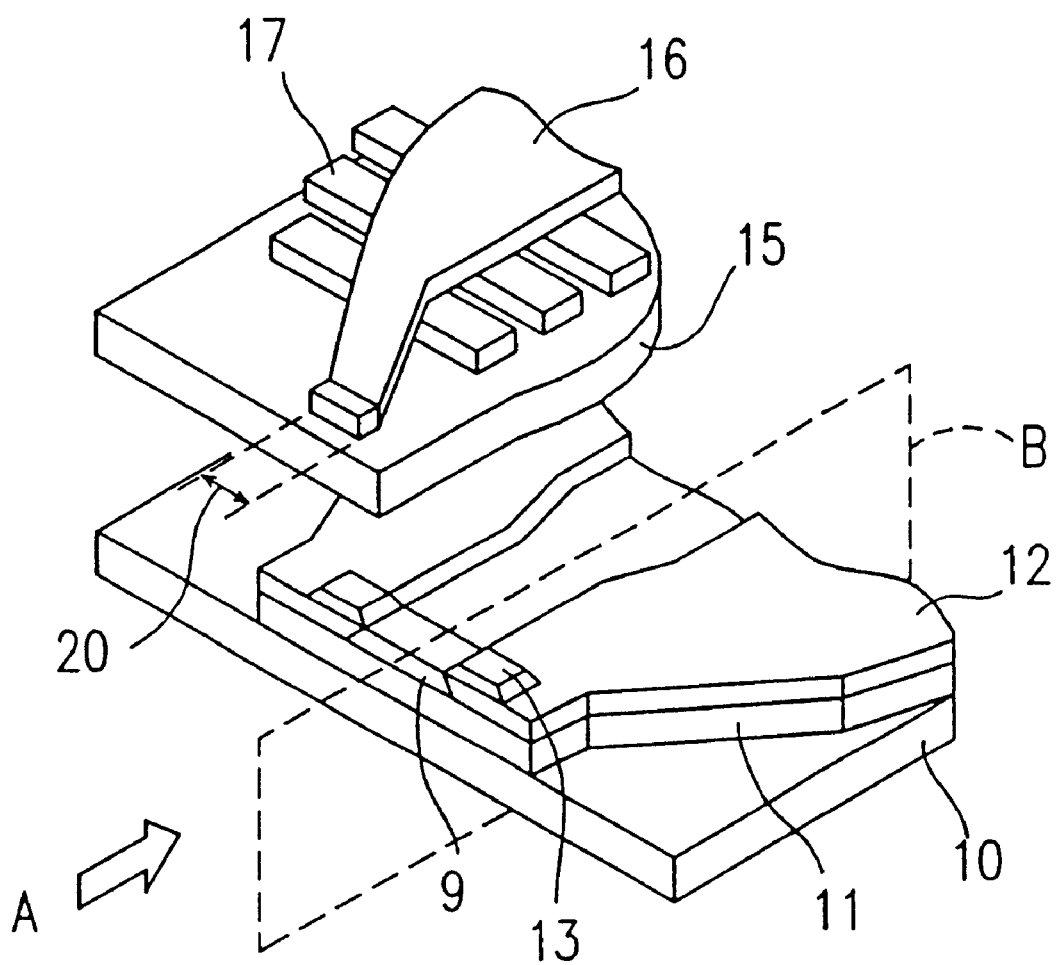
FIG. 4 is a perspective view illustrating the MR head of the present invention.
Figure 5:
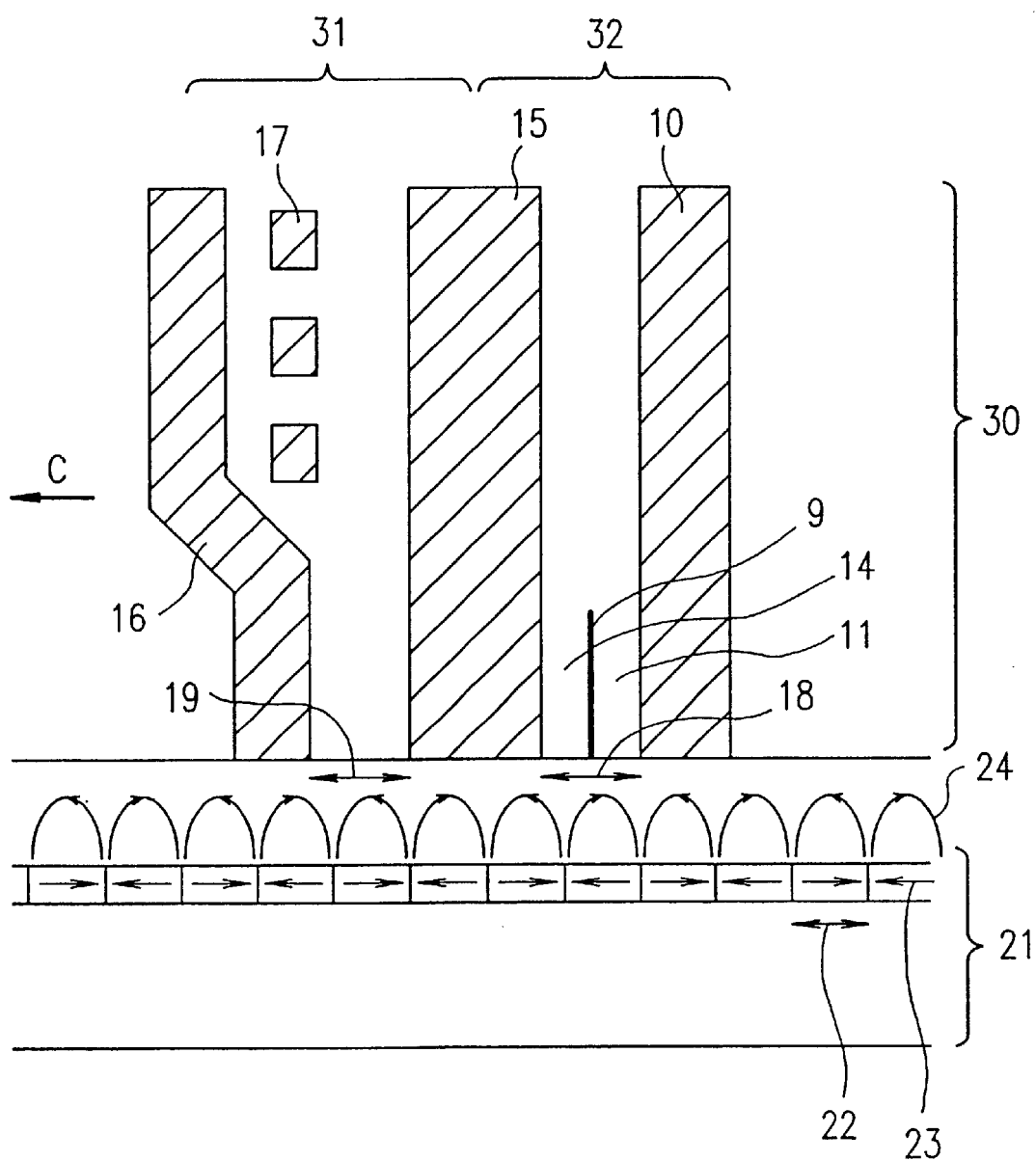
FIG. 5 is a cross-sectional view illustrating the MR head of the present invention along with a magnetic disk.

FIG. 4 illustrates an exemplary structure of an MR head of the present invention incorporating the above-described MR device. FIG. 3 illustrates the structure of the MR head as viewed from a direction indicated by A in FIG. 4. FIG. 5 illustrates a cross-sectional view taken along a plane indicated by B in FIG. 4. In the following description, FIG. 3 is mostly referred to.

Referring to FIG. 3, an MR device section 9 is interposed between upper and lower shield gaps 14 and 11. An insulation film such as an $Al_2O_3$ film, an $SiO_2$ film, or the like, may be used as the shield gaps 11 and 14. Upper and lower shields 16 and 10 are further provided on the shield gaps 14 and 11, respectively. A soft magnetic film such as an Ni—Fe alloy film may be used as the shield material. In order to control the magnetic domain of the MR device, a bias magnetic field is applied by a hard bias section 12 made of a material such as a Co—Pt alloy. While a hard film is used in this instance for applying a bias magnetic field, an antiferromagnetic film such as an Fe—Mn film can be used similarly. The MR device section 9 is insulated from the shields 10 and 15 by the shield gaps 11 and 14, and changes in the resistance of the MR device section 9 can be read by applying an electric current thereto through a lead section 13.

Figure 6:
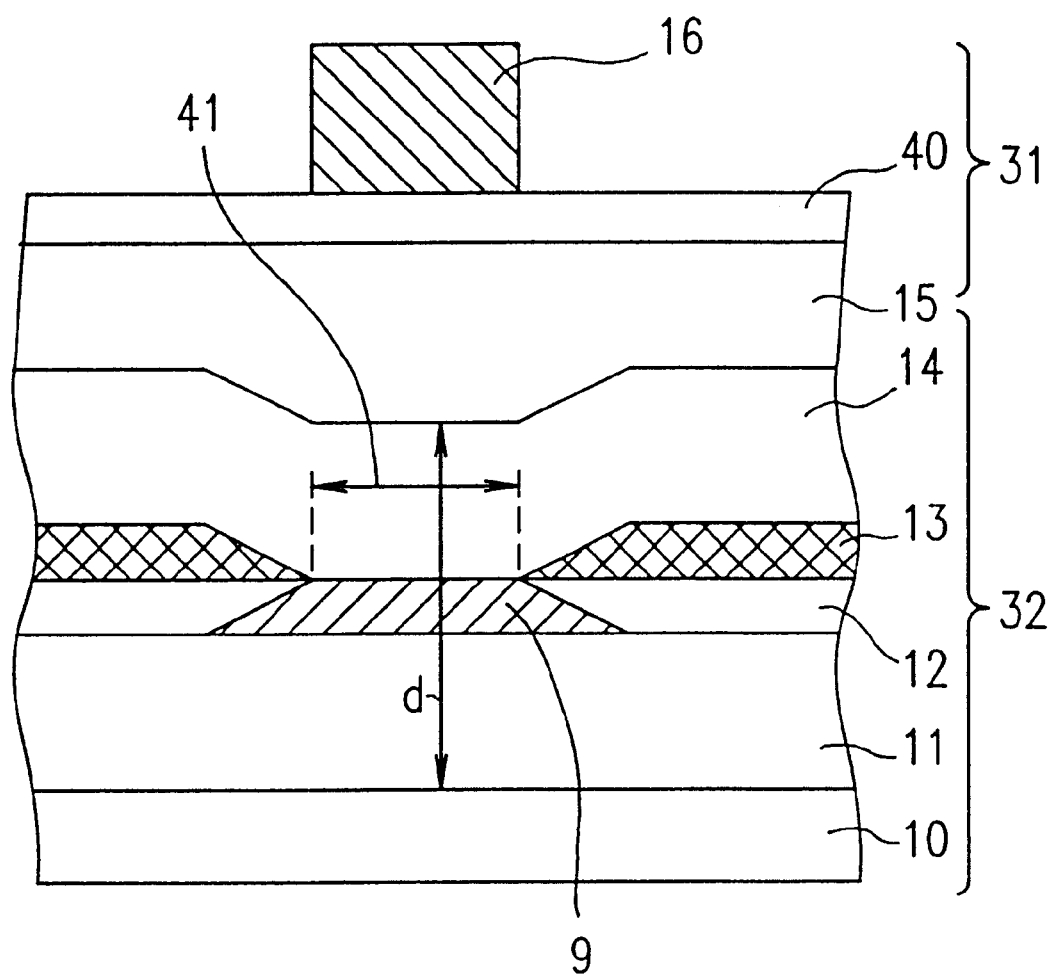
FIG. 6 is a cross-sectional view illustrating an MR head integrated with a recording head according to the present invention.

Since an MR head is a read only head, it is typically used in combination with an induction head for writing. FIGS. 5 and 6 illustrate a write head section 31 as well as a read head section 32. FIG. 6 illustrates the same structure as illustrated in FIG. 3 with the write head section 31 being additionally provided thereon. The write head section 31 includes an upper core 16 which is provided above the upper shield 15 via a recording gap film 40.

Figure 7:
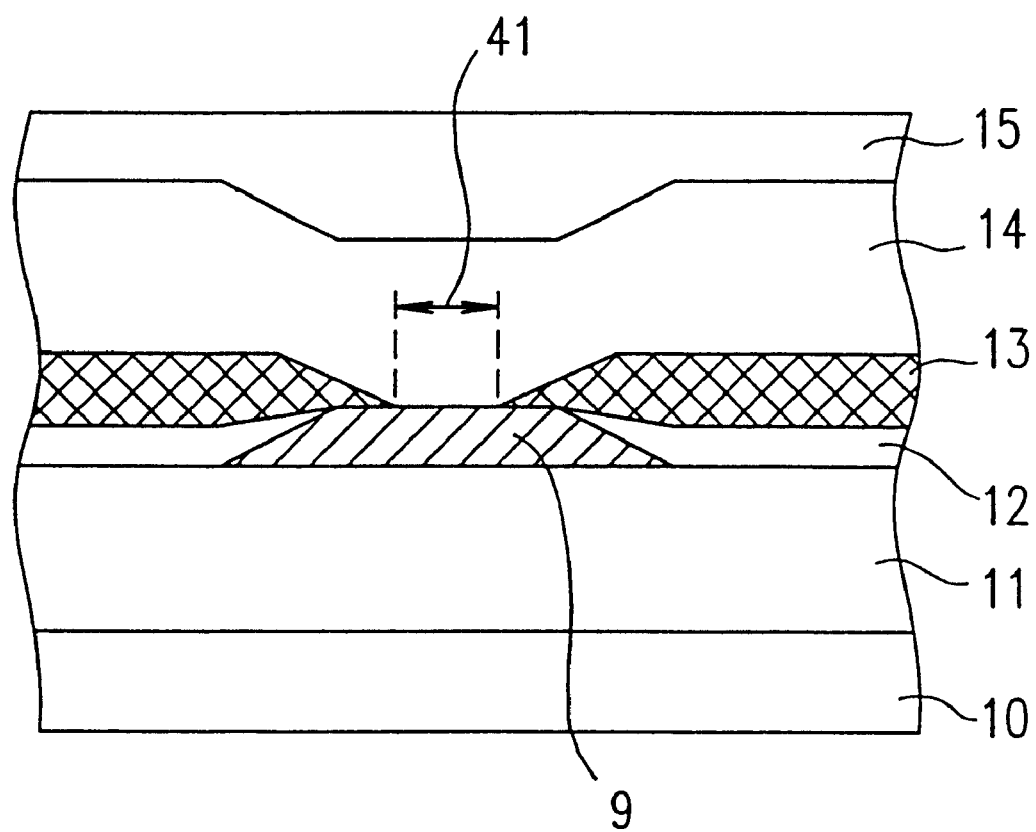
FIG. 7 is a cross-sectional view illustrating another MR head of the present invention.

While FIG. 6 illustrates an MR head having a conventional abutted junction, FIG. 7 illustrates another effective MR head with an overlaid structure in which a track width 41 can be more precisely controlled.

Therefore, the structure illustrated in FIG. 7 may be able to better account for a track width reduction resulting from an increase in the recording density.

Now, the recording and reproduction mechanism of the MR head will be described with reference to FIG. 5. Referring to FIG. 5, during a recording operation, a magnetic flux which is generated by an electric current and conducted through a coil 17 leaks through a space between the upper core 16 and the upper shield 15, thereby writing information on a magnetic disk 21. The head 30 moves in a direction indicated by an arrow c in the figure with respect to the magnetic disk 21, where it is possible to reverse a recording magnetization direction 23 by reversing the direction of the current flow though the coil 17. When the recording density is increased, the recording length (recording pitch) 22 becomes shorter, whereby it is necessary to reduce a recording gap length (recording gap pitch) 19 accordingly.

In a reproduction operation, a magnetic flux 24 leaking from a recording magnetization section of the magnetic disk 21 acts upon the MR device section 9 between the shields 10 and 15, thereby altering the resistance of the MR device. Since a current is conducted to the MR device section 9 through the lead section 13, a change in the resistance thereof can be read as a change in the voltage (output) thereof.

Figure 8:
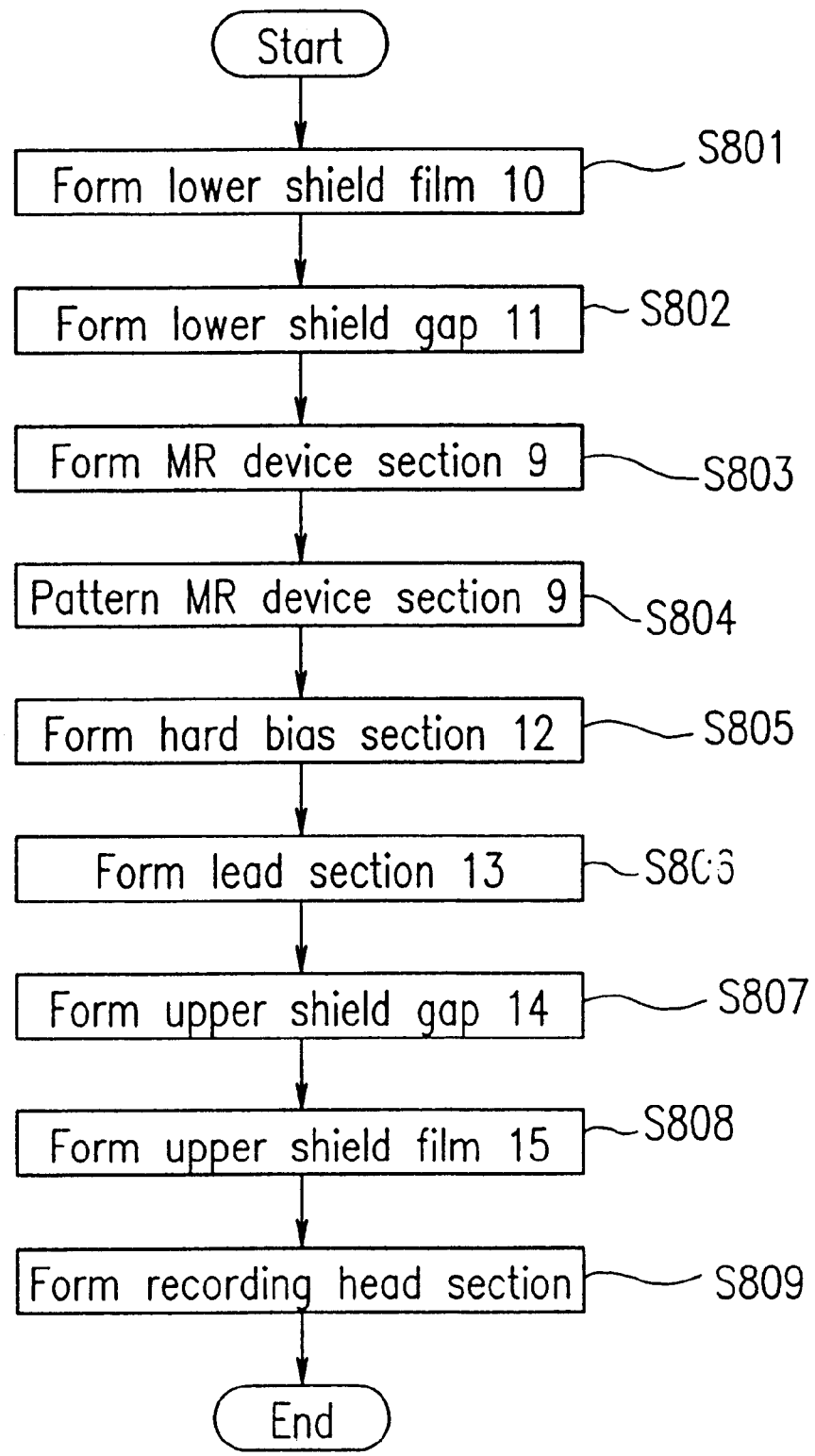
FIG. 8 is a flow chart illustrating steps of producing an MR head of the present invention.

Referring to FIG. 8, a method for producing the MR head will now be described.

First, the lower shield 10, as illustrated in FIG. 3, is formed on an appropriately processed substrate (S801). Then, the lower gap shield 11 is formed on the lower shield 10 (S802), and an MR device section layer is formed on the lower shield gap 11 (S803). After the MR device section layer is patterned into the MR device section 9, us illustrated in FIG. 3 (S804), the hard bias section 12 (S805) and the lead section 13 (SB06) are formed. Then, the upper shield gap 14 (S807) and the upper shield 15 (S808) are formed. Finally, the write head section 31 is formed, as illustrated in FIG. 6 (S809), thereby obtaining an MR head.

Figure 9:
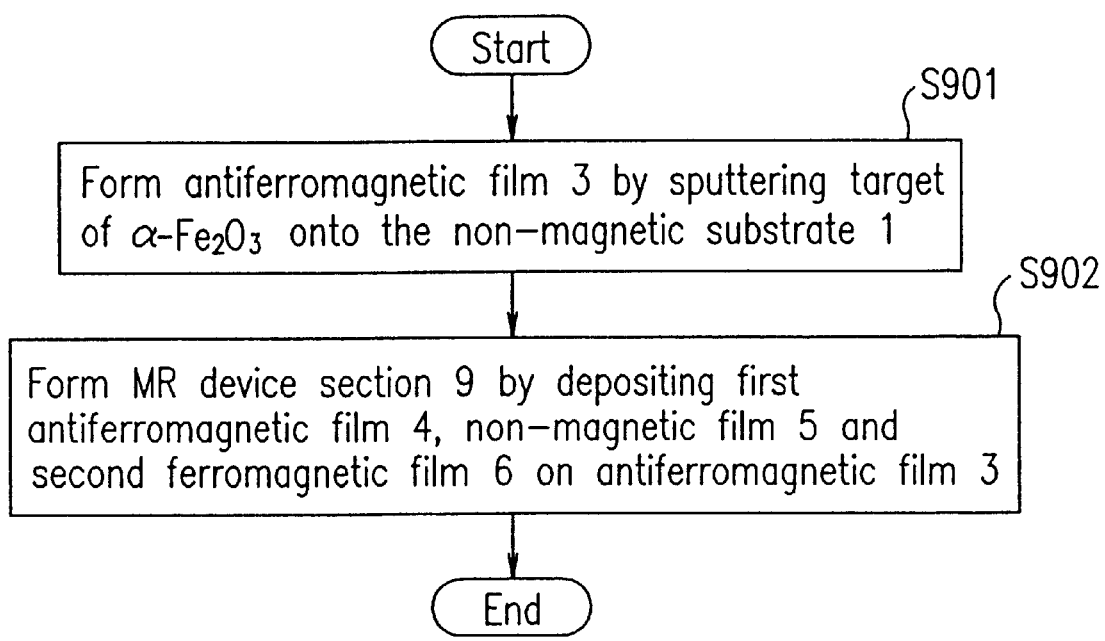
FIG. 9 is a flow chart illustrating steps of producing an MR device section of the present invention.

Referring to FIG. 9, the step of forming the MR device section 9 (S803) will be described in greater detail. The antiferromagnetic film 3 is formed by sputtering a target of $\alpha$-$Fe_2O_3$ onto the non-magnetic substrate 1, as illustrated in FIG. 1A (S901). Then, the first ferromagnetic film 4, the non-magnetic film 5 and the second ferromagnetic film 6 are deposited in this order on the antiferromagnetic film 3, thereby obtaining the MR device section 9 (S902).

In order to obtain the MR device as illustrated in FIG. 2B, the non-magnetic film 5A, the third ferromagnetic film 7 and the antiferromagnetic film 8 are deposited in this order on the second ferromagnetic film 6, thereby obtaining the MR device section.

In view of a future increase in a recording density of a hard disk drive, the recording wavelength (recording pitch) should be shortened, for which it is necessary to shorten the distance d (indicated by reference numeral 18 in FIG. 5) between the shields as illustrated in FIG. 3. As can be seen from FIG. 3, it is necessary to reduce the thickness of the MR device section 9. Preferably, the thickness of the MR device section 9, excluding the antiferromagnetic film, should be about 20 mm or less. The antiferromagnetic $\alpha$-$Fe_2O_3$ film used the present invention is an insulation film. Therefore, if the antiferromagnetic $\alpha$-$Fe_2O_3$ film is provided as a part of the insulation film (e.g., as a part of the gap shield 11 in FIG. 3), the thickness thereof is less restricted. When the antiferromagnetic $\alpha$-$Fe_2O_3$ film is provided as a part of the MR device section 9, however, it should be as thin as possible. Preferably, the thickness of the antiferromagnetic $\alpha$-$Fe2O_3$ film should be about 40 nm or less, and more preferably about 20 nm or less.

In the MR device section, an axis of easy magnetization (also referred to as an "easy axis") of the second ferromagnetic film (free layer) 6, as illustrated in FIGS. 1A, 1B, 2A and 2B is preferably arranged to be substantially perpendicular to the direction of a magnetic field of a signal to be detected, in order to suppress generation of Barkhausen noise during magnetization switching of the soft magnetic film.

The MR device and the MR head of the present invention will now be described by way of illustrative examples.

EXAMPLE 1

In Example 1, the MR devices each having the structure as illustrated in FIG. 1A on a glass substrate were produced using a sputtering apparatus having $\alpha$-$Fe_2O_3$, Co, $Co_{0.85}Fe_{0.15}$, $Ni_{0.68}Fe_{0.20}Co_{0.12}$, Cu and $Fe_{0.5}Mn_{0.5}$ as targets. After a vacuum chamber was exhausted to about $1\times10^{-8}$ Torr, an Ar gas was supplied therein so as to maintain the pressure therein at about 0.8 mTorr while the structure was formed on the substrate using a sputtering method. A $Co_{0.85}Fe_{0.15}$ alloy was used for the first ferromagnetic film 4, and Cu was used for the non-magnetic film 5. A layered structure including $Co_{0.85}Fe_{0.15}$ and $Ni_{0.68}Fe_{0.20}Co_{0.12}$ was employed for the second ferromagnetic film 6. Another Cu layer was formed on the second ferromagnetic film 6 as a protective layer.

Four different sample devices A1–A4 were produced. The respective materials and thicknesses used to is form the layers for each of the samples A1–A4 are shown below (thickness in nm shown in parentheses). The sample device A3 produced with an Fe—Mn antiferromagnetic film is a comparative device which employs a conventional Fe—Mn alloy. Since the antiferromagnetic film 3 has to be formed after the pin layer 4 is formed, the free layer was formed first (opposite order from that when the $\alpha$-$Fe_2O_3$ is employed). An RF cathode was used when the $\alpha$-$Fe_2O_3$ was employed, and a DC cathode was used when any other material was employed.

A1: $\alpha$-$Fe_2O_3$(50)/$Co_{0.86}Fe_{0.15}$(2)/Cu(2)/$Co_{0.45}Fe_{0.15}$(1)/ $Ni_{0.68}Fe_{0.20}Co_{0.12}$(2)/Cu(0.4)

A2 $\alpha$-$Fe_2O_3$(50)/Co(2)/Cu(2)/Co (1)/$Ni_{0.68}Fe_{0.20}Co_{0.12}$ (2)/Cu(0.4)

A3: $Ni_{0.88}Fe_{0.20}Co_{0.12}$(2)/$Co_{0.85}Fe_{0.15}$(1)/Cu(2)/ $C_{0.85}Fe_{0.15}$(2) $Fe_{0.5}Mn_{0.5}$(10)/cu(0.4)

A4: $\alpha$-$Fe_2O_3$(50)/$Ni_{0.8}Fe_{0.20}$(1) $Co_{0.85}Fe_{0.15}$(1)/Cu(2) $Co_{0.85}Fe_{0.15}$(1)/$Ni_{0.68}Fe_{0.20}Co_{0.12}$(2)/Cu(0.4)

The composition of each produced film was close to the original composition of the target material. For example, while $\alpha$-$Fe_2O_3$ has the inherent composition of Fe/O=1/1.5 an analysis showed that a produced $\alpha$-$Fe_2O_3$ film had a composition of Fe/O=1/1.45

The composition ratio does not have to be exactly 1/1.5. When $\alpha$-$Fe_2O_3$ was employed as a target, an excellent MR characteristics were obtained even when the production condition such as sputtering pressure was somewhat varied. Thus, the present invention can be effective as long as the composition Fe/O is in a range from about 1/1.35 to about 1/1.55.

Characteristics of a produced MR device (sample A1) were evaluated while applying a magnetic field of up to about 40 kA/m (500 Oe) by a DC 4-terminal method at room temperature.

Figure 10:
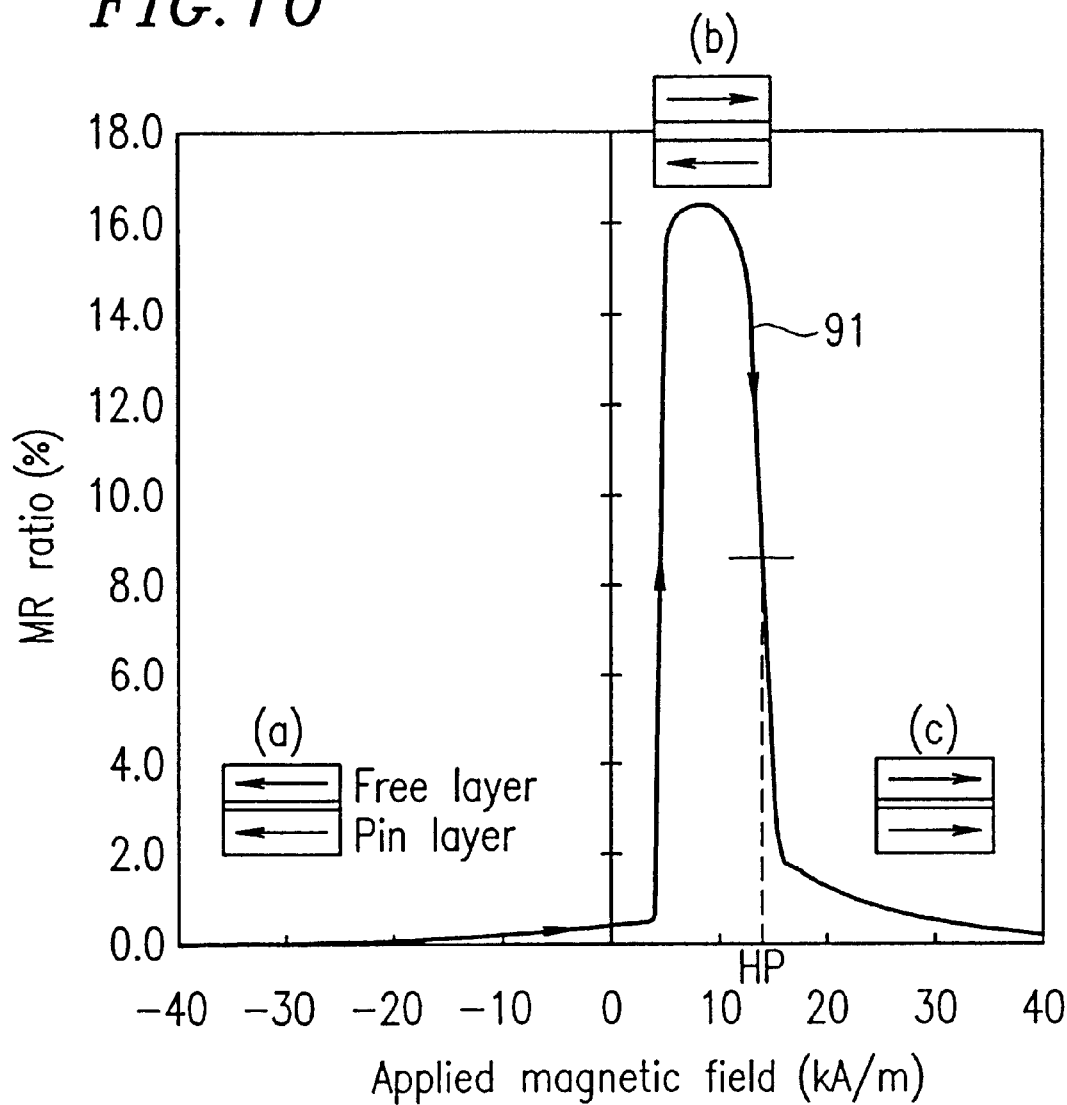
FIG. 10 is a graph illustrating an MR device curve of the present invention.

An MR curve 91 obtained for the sample A1 is shown in FIG. 10. In FIG. 10, the horizontal axis represents an applied magnetic field and the vertical axis represents the MR ratio, which is a rate of change (%) in resistance with the resistance measured at an applied magnetic field of 40 kA/m being a reference. FIG. 10 generally illustrates the respective magnetization directions of the pin layer (first ferromagnetic layer 4) and the free layer (second ferromagnetic layer 6) at the points (a), (b) and (c) along the MR curve 91. FIG. 10 shows that the MR device of the present Invention exhibits a very large MR ratio.

When a magnetic field of about −40 kA/m is applied, the pin layer 4 and the free layer 6 have substantially the same direction (point (a)). As the magnetic field is increased gradually and over the value "0", the magnetization direction of the second ferromagnetic film 6 (free layer)is reversed, and then the MR ratio rapidly increases toward point (b). When the applied positive magnetic field is further increased, the magnetization direction of the pin layer 4 is also reversed, thereby reducing the MR ratio toward point (c). Referring to FIG. 10, an exchange bias magnetic field "Hp" is defined as a magnitude of magnetic field being applied when the MR ratio becomes half of its peak after passing the peak (point (b)). This value Hp is used for evaluating the exchange bias magnetic field of the $\alpha$-$Fe_2O_3$ film. Typically, a greater exchange bias magnetic field indicates a more stable magnetization direction of the pin layer 4 (and thus more suitable for an MR device). Table 1 below shows the MR ratios and the Hp values of the samples A1–A4 measured as described above.

TABLE 1

| Sample | MR ratio (%) | Hp (kA/m) |
|---|---|---|
| A1 | 16.5 | 13 |
| A2 | 10.2 | 15 |
| A3 | 5.2 | 18 |
| A4 | 15.5 | 25 |

Table 1 shows the following. The sample MR device A1 which employs $\alpha$-$Fe_2O_3$ exhibits a greater magnetoresistance change then that of the sample device A3 which employs the conventional Fe—Mn alloy. Each of the MR devices A1, A2 , A4 using a Co—Fe alloy exhibits a larger MR ratio then that of the MR device A3 using Co. In the sample device A4 whose first magnetic layer is provided with a double-layered structure including an Ni—Fe layer and a Co—Fe layer, the exchange bias magnetic field is considerably large (nearly doubled from that of A1), while the MR ratio thereof is not considerably changed. It can be seen that the sample device A4 is more stable to the external magnetic field.

Another sample device A5 was produced employing materials and thicknesses as shown below, and the MR characteristics thereof were evaluated so as to determine the composition dependency of the $Co_{1-x}Fe_x$ (pin) layer (x: atomic composition ratio).

A5: $\alpha$-$Fe_2O_3$(60)/$Co_{1-x}Fe_x$(2)/Cu(3)/$Co_{0.85}Fe_{0.15}$(5)/Cu(0.4)

Figure 11:
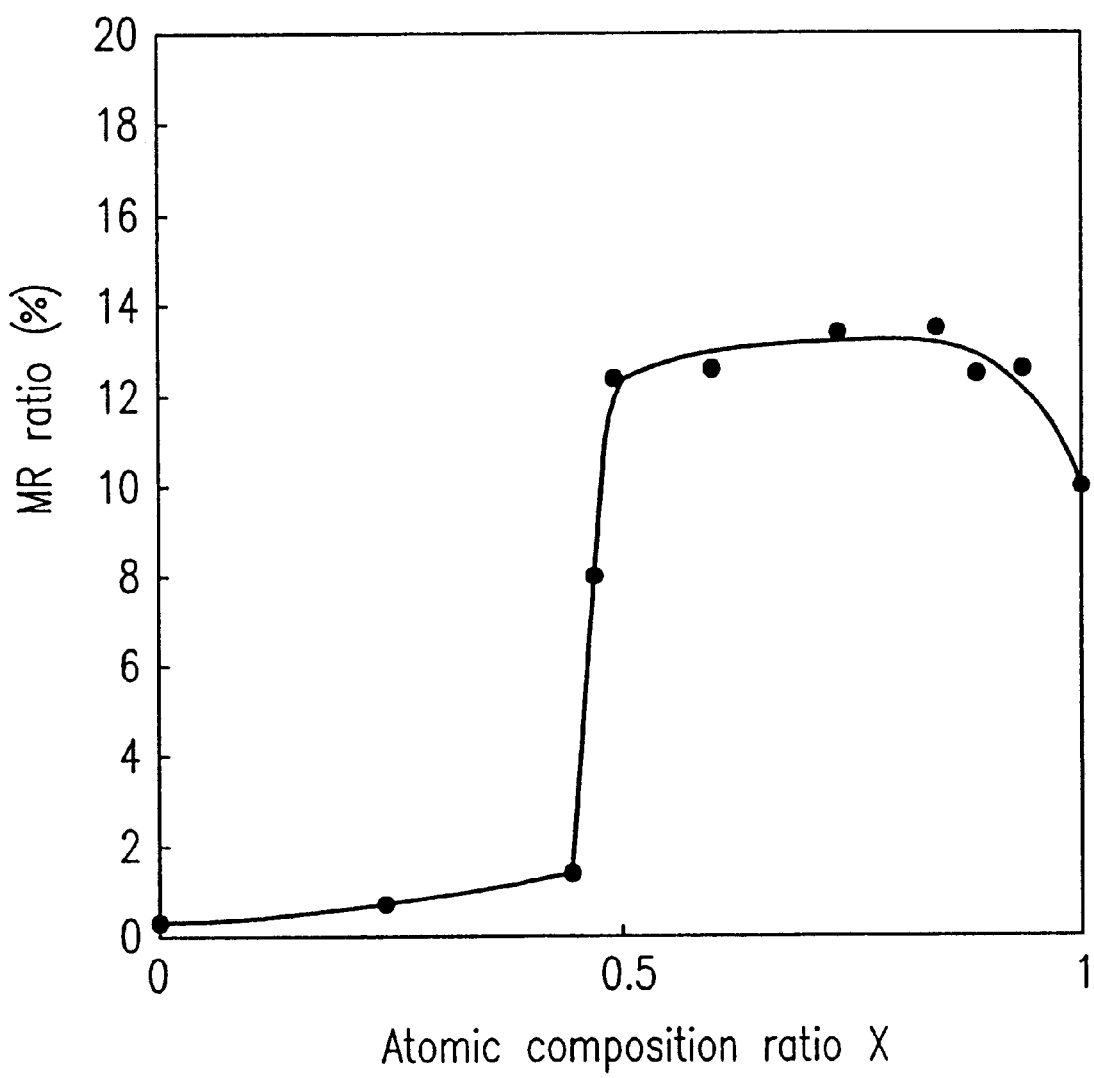
FIG. 11 is a graph illustrating the composition dependency of an MR device ratio of the present invention in which a $Co_{1-x}Fe_x$ alloy is employed as a first ferromagnetic layer.

FIG. 11 shows the composition dependency of the MR ratio of the sample device A5. It can be seen that the MR ratio varies substantially depending upon the composition ratio of $Co_{1-x}Fe_x$. In a range of $0<x\leq0.5$, the MR ratio shows a rapid increase.

Next, MR heads as illustrated in FIG. 3 were produced respectively using the sample devices A1 (the present invention), A2 and A3 (comparative examples), and the characteristics thereof were evaluated. In each of the produced MR heads, an $Al_2O_3$—TiC material was employed for the substrate, an $Ni_{0.8}Fe_{0.2}$ alloy for the shields 10 and 15, and $Al_2O_3$ for the shield gaps 11 and 14. Moreover, a Co—Pt alloy was used for the hard bias section 12, and AU for the lead section 13. The magnetic films were provided with an anisotropy in such a way that the easy axis of the pin layer (first ferromagnetic film 4) was substantially parallel to the direction of a magnetic field of a signal to be detected, whereby the easy axis of the free layer (second ferromagnetic film 6) was substantially perpendicular to the direction of the magnetic field of the signal to be detected. The magnetic films were deposited while using a permanent magnet so as to apply the films with a magnetic field in a desired direction of anisotropy in the film plane. The respective outputs of the produced heads were evaluated while applying an alternating signal magnetic field of about 50 Oe to the heads. The output of the MR head employing the MR device A1 of the present invention was about 5% and about 100% higher than those of the MR heads employing the comparative MR devices A2 and A3, respectively.

EXAMPLE 2

The following sample MR devices B1–B3 each having the structure as that illustrated in FIG. 1B were produced in the same manner as that of Example 1.

B1: Pt(10)/$\alpha$-$Fe_2O_3$(40)/$Co_{0.85}Fe_{0.15}$(2)/Cu(2.1)/$Co_{0.85}Fe_{0.15}$(1)/$Ni_{0.8}Fe_{0.20}$(5)/Cu(0.4)

B2: Au(10)/$\alpha$-$Fe_2O_3$(40)/$Co_{0.85}Fe_{0.15}$(2)/Cu(2.1)/$Co_{0.85}Fe_{0.15}$(1)/$Ni_{0.8}Fe_{0.20}$(5)/Cu(0.4)

B3: $\alpha$-$Fe_2O_3$(40)/$Co_{0.85}Fe_{0.15}$(2)/Cu(2.1)/$Co_{0.85}Fe_{0.15}$(1)/$Ni_{0.8}Fe_{0.20}$(5)/Cu(0.4)

The produced sample devices B1–B3 were subjected to the same evaluation as that of Example 1. The results are shown in Table 2 below.

TABLE 2

| Sample | MR ratio (%) | Hp (kA/m) |
|---|---|---|
| B1 | 15.1 | 37 |
| B2 | 12.2 | 29 |
| B3 | 10.6 | 9 |

Table 2 shows the following. By employing the Pt or Au underlying layer (B1, B2), it is possible to obtain a great exchange bias magnetic field Hp even when the $\alpha$-$Fe_2O_3$ layer is relatively thin. With no underlying layer and a relatively thin $\alpha$-$Fe_2O_3$ layer (B3), the exchange bias magnetic field is not efficiently effected and becomes weak. In such a case, the magnetization antiparallelism between the pin layer 4 and the free layer 6 is not completely achieved, thereby reducing the MR ratio.

EXAMPLE 3

The following sample MR devices C1–C12 each having the structure as that illustrated in FIG. 1A were produced in the same manner as that of Example 1, while employing a layered oxide structure as the antiferromagnetic layer. An RF cathode was used when an NiO or CoO film was employed.

C1: NiO(10)/$\alpha$-$Fe_2O_3$(30)/Co(2)/Cu(2.5)/$Co_{0.85}Fe_{0.15}$(1)/$Ni_{0.8}Fe_{0.20}$(5)/Cu(2)

C2: NiO(10)/$\alpha$-$Fe_2O_3$(20)/Co(2)/Cu(2.5)/$Co_{0.85}Fe_{0.15}$(1)/$Ni_{0.8}Fe_{0.20}$(5)/Cu(2)

C3: NiO(10)/$\alpha$-$Fe_2O_3$(10)/Co(2)/Cu(2.5)/$Co_{0.85}Fe_{0.15}$(1)/$Ni_{0.8}Fe_{0.20}$(5)/Cu(2)

C4: CoO(10)/$\alpha$-$Fe_2O_3$(30)/Co(2)/Cu(2.5)/$Co_{0.85}Fe_{0.15}$(1)/$Ni_{0.8}Fe_{0.20}$(5)/Cu(2)

C5: $\alpha$-$Fe_2O_3$(30)/Co(2)/Cu(2.5)/$CO_{0.85}Fe_{0.15}$(1)/$Ni_{0.8}Fe_{0.20}$(5)/Cu(2)

C6: $\alpha$-$Fe_2O_3$(40)/NiO(10)/Co(2)/Cu(2.5)/$Co_{0.85}Fe_{0.15}$(1)/$Ni_{0.8}Fe_{0.20}$(5)/Cu(2)

C7: $\alpha$-$Fe_2O_3$(30)/NiO(10)/Co(2)/Cu(2.5)/$Co_{0.85}Fe_{0.15}$(1)/$Ni_{0.8}Fe_{0.20}$(5)/Cu(2)

C8: $\alpha$-$Fe_2O_3$(20)/NiO(10)/Co(2)/Cu(2.5)/$Co_{0.85}Fe_{0.15}$(1)/$Ni_{0.8}Fe_{0.20}$(5)/Cu(2)

C9: $\alpha$-$Fe_2O_3$(10)/NiO(10)/Co(2)/Cu(2.5)/$Co_{0.85}Fe_{0.15}$(1)/$Ni_{0.8}Fe_{0.20}$(5)/Cu(2)

C10: NiO(40)/Co(2)/Cu(2.5)/$Co_{0.85}Fe_{0.15}$(1)/$Ni_{0.8}Fe_{0.20}$(5)/Cu(2)

C11: NiO(10)/$\alpha$-$Fe_2O_3$(8)/Co(2)/Cu(2.5)/$Co_{0.85}Fe_{0.15}$(1)/$Ni_{0.8}Fe_{0.20}$(5)/Cu(2)

C12: $\alpha$-$Fe_2O_3$(40)/NiO(4)/Co(2)/Cu(2.5)/$Co_{0.85}Fe_{0.15}$(1)/$Ni_{0.8}Fe_{0.20}$(5)/Cu(2)

The produced sample devices C1–C12 were subjected to the same evaluation as that of Example 1. The results are shown in Table 3 below.

TABLE 3

| Sample | MR ratio (%) | Hp (kA/m) |
|---|---|---|
| C1 | 12.1 | 20 |
| C2 | 12.3 | 18 |
| C3 | 12.1 | 15 |
| C4 | 9.9 | 10 |
| C5 | 1.8 | 7 |
| C6 | 11.2 | More than 40 |
| C7 | 11.5 | 39 |
| C8 | 11.1 | 35 |
| C9 | 11.3 | 20 |
| C10 | 9.4 | 9 |
| C11 | 6.7 | 11 |
| C12 | 3.1 | 8 |

As is apparent from Table 3, each of the MR devices C1–C4 and C6–C9 of the present invention which employ a layered oxide antiferromagnetic structure exhibit a larger MR ratio than that of the MR device C5 which employs the conventional single layer antiferromagnetic structure. It is believed that the reason for this is as follows. In the sample device C5, the exchange bias magnetic field to the first ferromagnetic layer is weak, whereby sufficient magnetization antiparallelism is not realized, thereby reducing the MR ratio. When a layered antiferromagnetic structure is provided, on the other hand, a sufficient exchange bias magnetic field is applied to the ferromagnetic layer, whereby sufficient magnetization antiparallelism is realized.

A comparison between the sample devices C1–C3 and sample devices C6–C9 shows the following. Each of the sample devices C1–C3 where the NiO layer is formed before forming the $\alpha$-Fe$_2$O$_3$ layer tends to have a larger MR ratio and a slightly lower Hp value. On the other hand, each of the sample devices C6–C9 where the $\alpha$-Fe$_2$O$_3$ layer is formed before forming the NiO layer tends to have a slightly lower MR ratio and a greater Hp value. Each of the sample devices C6–C9 which employs the $\alpha$-Fe$_2$O$_3$/NiO layered antiferromagnetic structure exhibits a larger MR ratio and a greater exchange bias magnetic field Hp than those of the sample device C10 which employs the NiO single layer antiferromagnetic structure.

Moreover, comparison between the sample devices C1–C3 of the present example and the sample device C11 of the comparative example shows that, when depositing the NiO film before depositing the $\alpha$-Fe$_2$O$_3$ film, it is preferable to provide the $\alpha$-Fe$_2$O$_3$ film with a thickness substantially equal to or greater than that of the NiO film.

Furthermore, comparison between the sample device C6 and the sample device C12 shows that, when depositing the $\alpha$-Fe$_2$O$_3$ film before depositing the NiO film, it is preferable to provide the NiO film with a thickness of at least about 5 nm.

EXAMPLE 4

The following sample MR devices D1–D6 each having the structure as that illustrated in FIG. 2 were produced in the same manner as that of Example 1.

D1: $\alpha$-Fe$_2$O$_3$(60)/Co$_{0.85}$Fe$_{0.15}$(2)/Cu(2)/Co$_{0.85}$Fe$_{0.15}$(0.4)/Ni$_{0.68}$Fe$_{0.20}$Co$_{0.12}$(5)/Co$_{0.85}$Fe$_{0.15}$(0.4)/Cu(2)/Co$_{0.85}$Fe$_{0.15}$(2)/Ir$_{0.2}$Mn$_{0.8}$(8)

D2: NiO(10)/$\alpha$-Fe$_2$O$_3$(30)/Co$_{0.85}$Fe$_{0.15}$(2)/Cu(2)/Co$_{0.85}$Fe$_{0.15}$(0.4)/Ni$_{0.68}$Fe$_{0.20}$Co$_{0.12}$(5)/Co$_{0.85}$Fe$_{0.15}$(0.4)/Cu(2)/Co$_{0.85}$Fe$_{0.15}$(2)/Ir$_{0.2}$Mn$_{0.8}$(8)

D3: $\alpha$-Fe$_2$O$_3$(20)/NiO(10)/Co$_{0.85}$Fe$_{0.15}$(2)/Cu(2)/Co$_{0.85}$Fe$_{0.15}$(0.4)/Ni$_{0.68}$Fe$_{0.20}$Co$_{0.12}$(5)/Co$_{0.85}$Fe$_{0.15}$(0.4)/Cu(2)/Co$_{0.85}$Fe$_{0.15}$(2)/Ir$_{0.2}$Mn$_{0.8}$(8)

D4: $\alpha$-Fe$_2$O$_3$(60)/Co$_{0.85}$Fe$_{0.15}$(2)/Cu(2)/Co$_{0.85}$Fe$_{0.15}$(0.4)/Ni$_{0.68}$Fe$_{0.20}$Co$_{0.12}$(5)/Co$_{0.85}$Fe$_{0.15}$(0.4)/Cu(2)/Co$_{0.85}$Fe$_{0.15}$(2)/FeMn(8)

D5: $\alpha$-Fe$_2$O$_3$(60)/Co$_{0.85}$Fe$_{0.15}$(2)/Cu(2)/Co$_{0.85}$Fe$_{0.15}$(0.4)/Ni$_{0.68}$Fe$_{0.20}$Co$_{0.12}$(5)/Co$_{0.85}$Fe$_{0.15}$(0.4)/Cu(2)/Co$_{0.85}$Fe$_{0.15}$(2)/$\alpha$-Fe$_2$O$_3$(60)

D6: Ir$_{0.2}$Mn$_{0.8}$(8)/Co$_{0.85}$Fe$_{0.15}$(2)/Cu(2)/Co$_{0.85}$Fe$_{0.15}$(0.4)/Ni$_{0.68}$Fe$_{0.20}$Co$_{0.12}$(5)/Co$_{0.85}$Fe$_{0.15}$(0.4)/Cu(2)/Co$_{0.85}$F$_{0.15}$(2)/Ir$_{0.2}$Mn$_{0.8}$(8)

Figure 12:
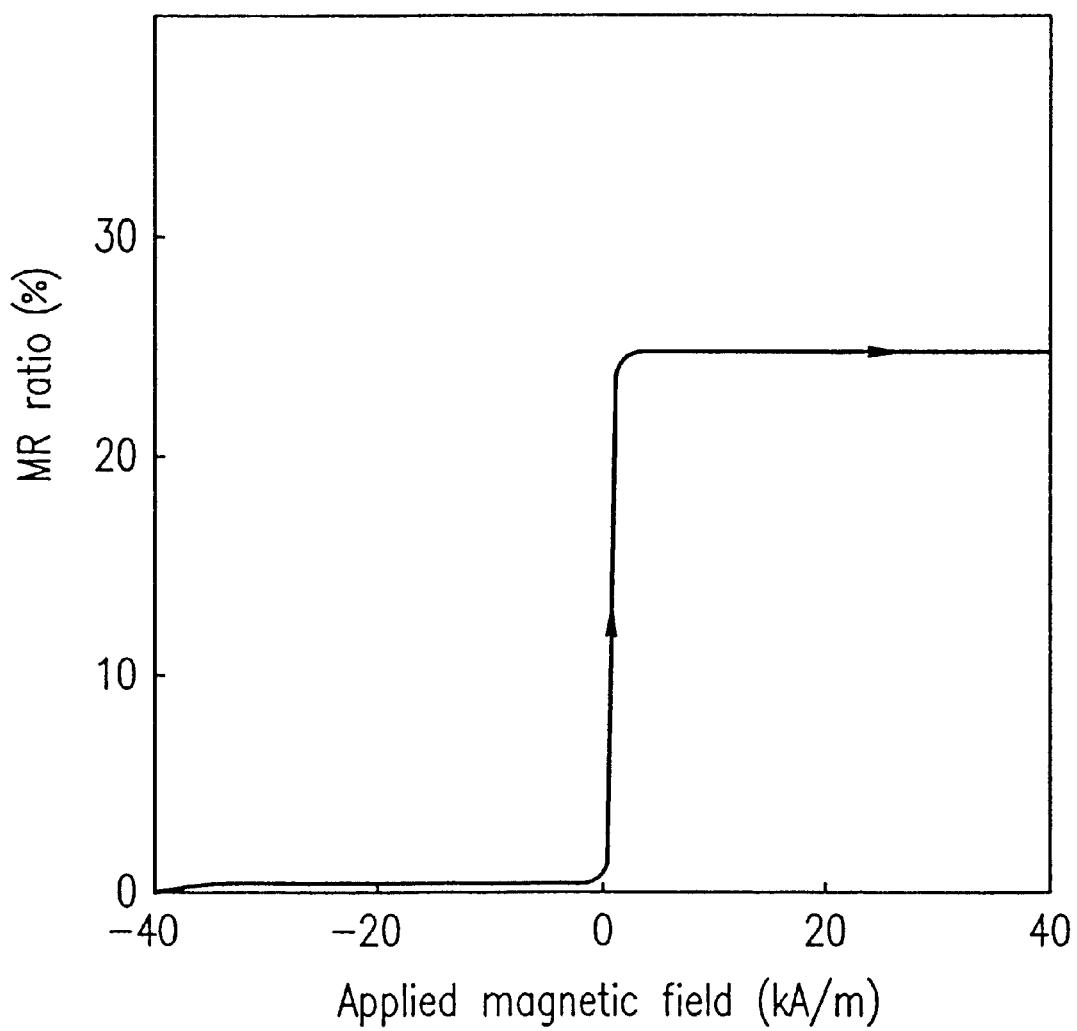
FIG. 12 is a graph illustrating an MR device curve of the present invention.

FIG. 12 shows the MR curve of the sample device D1 as measured in the same manner as that of Example 1. It can be seen that the sample device D1 has a very high MR ratio and a sufficient bias magnetic field. The measured MR ratios of the respective sample devices D1–D6 are shown in Table 4 below.

TABLE 4

| Sample | MR ratio (%) |
|---|---|
| D1 | 24.3 |
| D2 | 25.1 |
| D3 | 21.5 |
| D4 | 14.2 |
| D5 | 20.5 |
| D6 | 7.8 |

As shown in Table 4, although the MR ratio of each of the sample devices D2 and D3 of the present example is about the same as that of the sample device D1, that MR ratio can be realized with a smaller thickness due to the layered antiferromagnetic structure. The MR ratio of each of the sample devices D2 and D3 of the present example is greater than those of the comparative sample devices D4–D6. It can also be seen that the sample device D4 (which employs an Fe—Mn material for the second antiferromagnetic film) and the sample device D6 (which employs an Ir—Mn material for both of the first and second antiferromagnetic films) each have a low MR ratio. The sample device D5 (which employs an $\alpha$-Fe$_2$O$_3$ material for both of the first and second antiferromagnetic films) has a large MR ratio, but the exchange bias magnetic field Hp is only about half of that of the sample device D1. This is because the $\alpha$-Fe$_2$O$_3$ film employed as the antiferromagnetic film has only a weak pinning effect. Thus, a metallic antiferromagnetic film such as an Ir—Mn film is preferred as the second antiferromagnetic film.

EXAMPLE 5

In this example, a plurality of sample devices E were produced with various surface roughnesses by previously processing the surfaces of the glass substrates with an ion beam under various conditions. The sample devices were produced in the same manner as that of Example 1.

E: Au(20)/$\alpha$-Fe$_2$O$_3$(20)/Co$_{0.85}$Fe$_{0.15}$(2)/Cu(2)/Ni$_{0.68}$Fe$_{0.20}$Co$_{0.12}$(3)

Table 5 below shows the respective surface roughnesses and the MR ratios of the produced sample devices. The surface roughness was evaluated by using an STM (Scanning Tunneling Microscope). Ten 10 nm×10 nm areas were randomly selected across the 10 mm×10 mm surface of each sample device. The surface roughness of each area was determined as the difference in height between the highest point therein and the lowest point therein. The surface roughness values of the ten areas were averaged to obtain the surface roughness of that sample device.

TABLE 5

| Surface roughness (nm) | MR ratio (%) |
|---|---|
| 0.38 | 13.3 |
| 0.45 | 12.9 |
| 0.52 | 8.6 |
| 0.68 | 4.3 |
| 1.22 | 2.7 |

Table 5 shows that when the surface roughness is about 0.5 nm or less, the device exhibits a large MR ratio.

EXAMPLE 6

A sample device F was produced as follows. An Si substrate was used as the substrate, and a substrate preparation process chamber was exhausted to about 2×10$^{-6}$ Torr or less, after which an Ar gas was introduced into the preparation chamber until the pressure therein was about 4.5×10$^{-4}$ Torr. Then, the substrate surface was cleaned for about 20 minutes using an ECR ion source with an acceleration voltage of about 100 V. Thereafter, the resulting substrate was transferred into a deposition chamber which was in communication with the preparation chamber, and the sample device F was produced in the same manner as that of Example 1.

F: $\alpha$-Fe$_2$O$_3$(t)/Co(2)/Cu(2)/Co$_{0.90}$Fe$_{0.10}$(1)/Ni$_{0.8}$Fe$_{0.20}$(5)/Ta(3)

Figure 13:
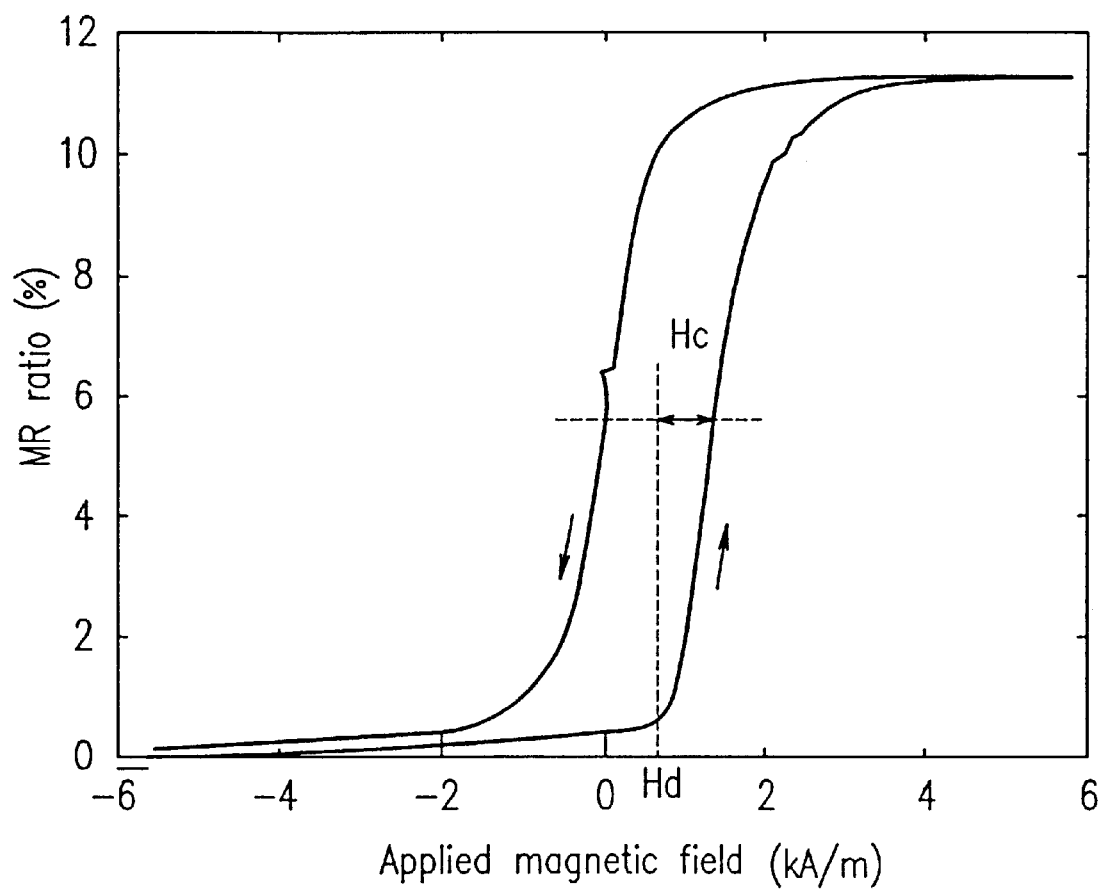
FIG. 13 is a graph illustrating another MR device curve of the present invention.

FIG. 13 shows an MR curve for the sample device F where the thickness of the $\alpha$-Fe$_2$O$_3$ film (t) was t=10. The MR curve was measured while applying a weak magnetic field of about 6 kA/m, where it is possible to observe changes in the MR ratio solely due to the reversing magnetization direction of the free layer 6 while the magnetization direction of the pin layer 4 is fixed. In FIG. 13, "Hc" denotes a value which corresponds to the coercive force of the magnetization curve, and "Hd" denotes a shift between the center of the MR curve and the zero magnetic field. Regarding the operation of the MR device, the MR curve shows that as the values Hc and Hd are smaller, the resistance change near the zero magnetic field is greater, indicating that the MR device is a desirable device with a high sensitivity.

Figure 14:
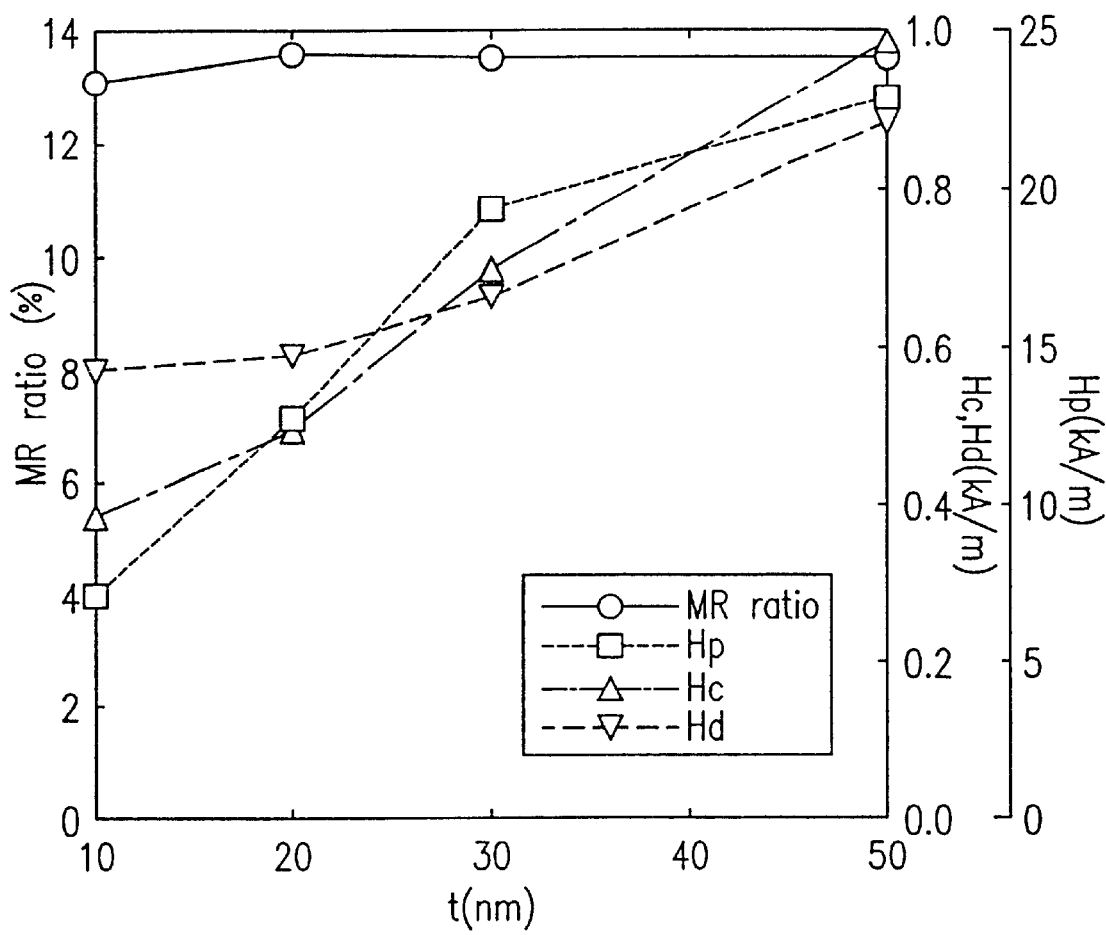
FIG. 14 is a graph illustrating the MR ratio, Hp, Hc and Hd with respect to the thickness (t) of an $\alpha$-$Fe_2O_3$ film in an MR device of the present invention.

FIG. 14 shows the MR ratio, Hp, Hd and Hc of the sample device F with respect to the thickness of the $\alpha$-$Fe_2O_3$ film (t). Referring to FIG. 14, the MR ratio does not considerably change as the thickness of the $\alpha$-$Fe_2O_3$ film (t) is varied in this range. The value Hp increases as the thickness of the $\alpha$-$Fe_2O_3$ film (t) increases. Although this may present a problem when the $\alpha$-$Fe_2O_3$ layer is thin, the value Hp can be maintained at about 40 kA/m or greater by processing the sample device at about 300° C. In a magnetic field of about 40 kA/m (this can be appreciated also from the following Example 7).

Thus, Hp does not present a critical problem. The value Hc or Hd decreases as the thickness of the $\alpha$-$Fe_2O_3$ film (t) decreases.

Thus, it can be seen from FIG. 14 that the MR device of the present invention (where the thickness of the $\alpha$-$Fe_2O_3$ film (t) is in a range between about 10 nm and about 40 nm) is most suitable for use as a high sensitive MR device, with a higher magnetic field sensitivity than that of the conventional device (where the thickness of the $\alpha$-$Fe_2O_3$ film (t) is about 50 nm or greater).

EXAMPLE 7

A sample MR device G was produced on a glass substrate in the same manner as that of Example 1.

G: $\alpha$-$Fe_2O_3$(t)/Co(2)/Cu(2)/Co(5)/Cu(0.4)

The sample device G was subjected to a heat treatment for about 30 minutes in a vacuum of about $10^{-5}$ Torr or less while applying thereto a magnetic field of about 40 kA/m.

Figure 15:
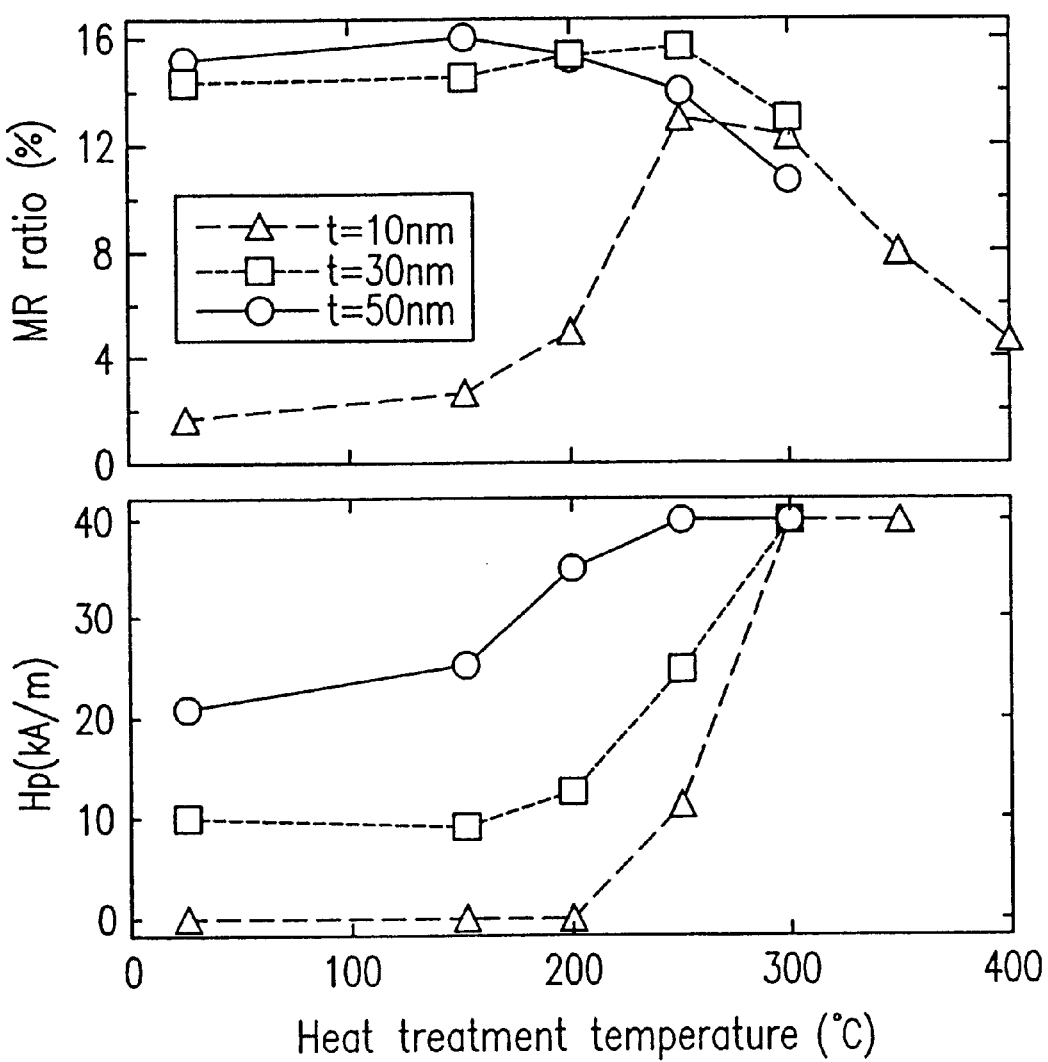
FIG. 15 shows graphn illustrating the MR ratio and Hp with respect to the temperature of a heat treatment in an MR device of the present invention.

FIG. 15 shows the MR ratio and the value Hp obtained from an MR curve which was measured after the heat treatment. After a heat treatment at 300° C., the MR ratio of one sample device G (where the thickness of the $\alpha$-$Fe_2O_3$ film (t) is about 50 nm) is reduced by about 30% of the MR ratio before the heat treatment (at about 25° C. in FIG. 15), while the MR ratio of another sample device G (where the thickness of the $\alpha$-$Fe_2O_3$ film (t) is about 30 nm) is reduced only by about 10% of the MR ratio before the heat treatment. When the thickness of the $\alpha$-$Fe_2O_3$ film (t) is about 10 nm, the MR ratio is relatively low before the heat treatment, but it increases as the device undergoes the heat treatment. After the heat treatment at about 300° C., the sample device G where (t)=about 10 nm and the sample device G where (t)=about 30 nm have larger MR ratios, and thus greater heat stabilities.

In the above description, the heat treatment was conducted for about 30 minutes. In order to produce an actual MR head, however, a longer heat treatment is required. After a 3 hour heat treatment was conducted, the MR ratio of the sample device G where (t)=about 50 nm was reduced by about 70%, while the MR ratio of the sample device G where (t)=about 10 nm and the MR ratio of the sample device G where (t)=about 30 nm were reduced only by about 20% or less. Thus, in view of the heat stability of the MR ratio of the MR device, the thickness of the $\alpha$-$Fe_2O_3$ film in a range between about 10 nm and about 40 nm is preferable.

In FIG. 15, since the MR ratio is measured with a magnetic field of about 40 kA/m, the value Hp of about 40 kA/m in FIG. 15 indicates that the value Hp is actually equal to or higher than 40 kA/m. As shown in FIG. 15, the value Hp exceeds about 40 kA/m after a heat treatment at about 300° C. Therefore, it is indicated that a practically sufficient Hp value can be obtained after subjecting the sample device G to a heat treatment at about 300° C.

EXAMPLE 8

The following sample MR devices H1–H3 were produced in the same manner as that of Example 6. The sample device H2 has an indirect exchange coupling film as illustrated in FIG. 2A.

H1: $\alpha$-$Fe_2O_3$(20)/Co(2)/Cu(2)/$Co_{0.90}Fe_{0.10}$(1)/$Ni_{0.6}Fe_{0.20}$(5)/Ta(5)

H2: $\alpha$-$Fe_2O_3$(20)/Co(1)/Ru(0.7)/Co(2)/Cu(2)/$Co_{0.90}Fe_{0.10}$(1)/$Ni_{0.8}Fe_{0.20}$(5)/Ta(5)

H3: NiO(20)/Co(1)/Ru(0.7)/Co(2)/Cu(2)/$Co_{0.90}Fe_{0.10}$(1)/$Ni_{0.8}Fe_{0.20}$(5)/Ta(5)

The MR changes of the produced sample devices H1–H3 were evaluated in the same manner as that of Example 1. The results are shown in Table 6 below.

TABLE 6

| Sample | MR ratio (%) | Hp (kA/m) |
|---|---|---|
| H1 | 12.5 | 9.2 |
| H2 | 8.4 | 105 |
| H3 | 5.2 | 108 |

As illustrated above, the sample device H2 of the present example, as compared with the sample device H1 which does not have the indirect exchange coupling film, has a reduced MR ratio but a greater bias magnetic field Hp. Thus, it can be seen that the sample device H2 is an MR device with a stable operation.

The comparative sample device H3 employs NiO as a material for the antiferromagnetic film. The sample device H3 exhibited characteristics substantially the same as those of the sample device H1 at room temperature. At about 200° C., however, the sample device H3 exhibited considerably poor characteristics with an MR ratio of about 2.2% and a value Hp of about 5 kA/m, while the sample device H2 exhibited an MR ratio of about 7.1% and a value Hp of about 52 kA/m.

Although Co is employed for the magnetic layers 51 and 53 which is used in the indirect exchange coupling film 50 in the above examples, a Co—Fe alloy, a Co—Ni—Fe alloy, or the like, can alternatively be used in place of Co. In such a case, the thickness of each magnetic film should preferably be in a range between about 1 nm and about 4 nm. Moreover, the respective thicknesses of the ferromagnetic films 51 and 53 should differ from each other by at least about 0.5 nm.

While Cu, Ru, Ag, or the like, can be used as the non-magnetic film 52 in the indirect exchange coupling film 50, Ru is most preferred. The thickness of the non-magnetic film 52 should preferably be in a range between about 0.3 nm and about 1.2 nm.

Moreover, when one of the ferromagnetic films 4 and 7 is an indirect exchange coupling film in the structure as illustrated in FIG. 2B, a greater bias magnetic field can be obtained. The following sample films H4 and H5 were produced each having basically the same structure as that illustrated in FIG. 2B.

H4: $\alpha\text{-}Fe_2O_3(20)/Co(2)/Cu(2)/Co_{0.90}Fe_{0.10}(1)/Ni_{0.8}Fe_{0.20}(5)/Co_{0.90}Fe_{0.10}(1)/Cu(2)/Co(2)/Pt_{0.50}Mn_{0.50}(25)/Ta(6)$ H5: $\alpha\text{-}Fe_2O_3(20)/Co(2)/Ru(0.7)/Co(3)/Cu(2)/Co_{0.90}Fe_{0.10}(1)/Ni_{0.8}Fe_{0.20}(5)/Co_{0.90}Fe_{0.10}(1)/Cu(2)/Co(2)/Pt_{0.50}Mn_{0.50}(25)/Ta(5)$

TABLE 7

| Sample | MR ratio (%) | Hp (kA/m) |
| --- | --- | --- |
| H4 | 22.3 | 18 |
| H5 | 19.5 | 75 |

As shown in Table 7, when the indirect exchange coupling film (Co/Ru/Co film) is used, it is possible to produce a film having a large Hp, though the MR ratio is is smaller than when using a single Co layer.

In this example, the indirect exchange coupling film is used for the ferromagnetic film 4 in the structure of FIG. 2B. Alternatively, the indirect exchange coupling film may be used for the ferromagnetic film 7, or the indirect exchange coupling film may be used for both of the ferromagnetic films 4.

As described above, according to the present invention, an $\alpha\text{-}Fe_2O_3$ film or an $\alpha\text{-}Fe_2O_3/NiO$ layered film is used to precisely control the surface roughness of the interface, whereby it is possible to realize an MR device which exhibits a large MR ratio.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A magnetoresistance effect device, comprising a multilayer film, the multilayer film comprising a layered antiferromagnetic film structure, an indirect exchange coupling film, a first non-magnetic film and a first ferromagnetic film, which are provided in this order on a non-magnetic substrate directly or via an underlying layer, wherein:

the layered antiferromagnetic film structure comprises a first antiferromagnetic film and an $\alpha\text{-}Fe_2O_3$ film;

the indirect exchange coupling film comprises a second non-magnetic film and a pair of second ferromagnetic films interposing the second non-magnetic film therebetween; and respective thicknesses of the pair of second ferromagnetic films differ from each other by at least about 0.5 nm.

2. A magnetoresistance effect device according to claim 1, wherein a main component of each second ferromagnetic film is Co.

3. A magnetoresistance effect device according to claim 2, wherein a main component of the second non-magnetic film is Ru.

4. A magnetoresistance head, comprising:

a magnetoresistance effect device according to claim 2; and a shield gap section for insulating the magnetoresistance effect device from a shield section.

5. A magnetoresistance effect device according to claim 1, wherein the first antiferromagnetic film is a NiO film or a CoO film.

6. A magnetoresistance effect device according to claim 1, wherein the $\alpha\text{-}Fe_2O_3$ film is layered on the first antiferromagnetic film between the indirect exchange coupling and first antiferromagnetic films.

7. A magnetoresistance effect device according to claim 1, wherein the first antiferromagnetic film is layered on the $\alpha\text{-}Fe_2O_3$ film between the indirect exchange coupling and $\alpha\text{-}Fe_2O_3$ films.

8. A magnetoresistance effect device according to claim 1, wherein the $\alpha\text{-}Fe_2O_3$ film has a thickness equal to or greater than the first antiferromagnetic film.

* * * * *

UNITED STATES PATENT AND TRADEMARK OFFICE
CERTIFICATE OF CORRECTION

PATENT NO.      : 6,597,547 B1
DATED           : July 22, 2003
INVENTOR(S)     : Kawawake et al.

It is certified that error appears in the above-identified patent and that said Letters Patent is hereby corrected as shown below:

<u>Title page,</u>
Item [75], Inventors, replace "Hirakata" with -- Uji --.

Signed and Sealed this

Ninth Day of December, 2003

JAMES E. ROGAN
*Director of the United States Patent and Trademark Office*